US009502537B2

(12) United States Patent
Kitamura et al.

(10) Patent No.: US 9,502,537 B2
(45) Date of Patent: Nov. 22, 2016

(54) METHOD OF SELECTIVELY REMOVING A REGION FORMED OF SILICON OXIDE AND PLASMA PROCESSING APPARATUS

(71) Applicant: TOKYO ELECTRON LIMITED, Tokyo (JP)

(72) Inventors: Akinori Kitamura, Miyagi (JP); Hiroto Ohtake, Miyagi (JP); Eiji Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/469,784

(22) Filed: Aug. 27, 2014

(65) Prior Publication Data

US 2015/0064922 A1    Mar. 5, 2015

(30) Foreign Application Priority Data

Aug. 30, 2013  (JP) ................................. 2013-180267
Dec. 11, 2013  (JP) ................................. 2013-256118

(51) Int. Cl.

| H01L 29/66 | (2006.01) |
|---|---|
| H01J 37/32 | (2006.01) |
| H01L 21/30 | (2006.01) |

(Continued)

(52) U.S. Cl.
CPC ... *H01L 29/66795* (2013.01); *H01J 37/32192* (2013.01); *H01J 37/32238* (2013.01); *H01J 37/32449* (2013.01); *H01J 37/32724* (2013.01); *H01J 37/32862* (2013.01); *H01J 37/32926* (2013.01); *H01L 21/3065* (2013.01); *H01L 21/31116* (2013.01)

(58) Field of Classification Search
CPC .................. H01L 29/66795; H01L 21/31116; H01L 21/3065; H01L 21/30655; H01J 37/32238; H01J 37/32192; H01J 37/32724; H01J 37/32862; H01J 37/32449; H01J 37/32926

See application file for complete search history.

(56) References Cited

U.S. PATENT DOCUMENTS

| 5,306,671 | A | * | 4/1994 | Ogawa | .............. | H01L 21/02046 257/E21.193 |
|---|---|---|---|---|---|---|
| 5,328,558 | A | * | 7/1994 | Kawamura | ....... | H01L 21/31116 148/DIG. 17 |
| 5,863,339 | A | * | 1/1999 | Usami | ................... | C23C 16/402 118/723 E |

(Continued)

FOREIGN PATENT DOCUMENTS

| JP | 2007-515074 A | 6/2007 |
|---|---|---|
| JP | 2008-16869 A | 1/2008 |

(Continued)

*Primary Examiner* — Jeffrie R Lund
(74) *Attorney, Agent, or Firm* — Rothwell, Figg, Ernst & Manbeck, P.C.

(57) ABSTRACT

Provided is a method of selectively removing a first region from a workpiece which includes the first region formed of silicon oxide and a second region formed of silicon. The method performs a plurality of sequences. Each sequence includes: forming a denatured region by generating plasma of a processing gas that contains hydrogen, nitrogen, and fluorine within a processing container that accommodates the workpiece so as to denature a portion of the first region, and removing the denatured region within the processing container. In addition, a sequence subsequent to a predetermined number of sequences after a first sequence among the plurality of sequences further includes exposing the workpiece to plasma of a reducing gas which is generated within the processing container, prior to the forming of the denatured region.

23 Claims, 27 Drawing Sheets

(51) Int. Cl.
*H01L 21/3065* (2006.01)
*H01L 21/311* (2006.01)

(56) References Cited

U.S. PATENT DOCUMENTS

| | | | |
|---|---|---|---|
| 6,706,334 B1* | 3/2004 | Kobayashi | H01J 37/32082 134/1.1 |
| 9,330,973 B2* | 5/2016 | Watanabe | H01L 21/76897 |
| 2007/0030380 A1* | 2/2007 | Higuchi | H01L 27/14625 348/340 |
| 2015/0064922 A1* | 3/2015 | Kitamura | H01L 21/31116 438/715 |
| 2015/0162203 A1* | 6/2015 | Kitamura | H01L 21/3065 438/710 |
| 2016/0005651 A1* | 1/2016 | Watanabe | H01L 21/31116 438/702 |

FOREIGN PATENT DOCUMENTS

| | | |
|---|---|---|
| JP | 2013-503482 A | 1/2013 |
| WO | 2005/062344 A1 | 7/2005 |
| WO | 2011/025655 A2 | 3/2011 |

\* cited by examiner

METHOD OF SELECTIVELY REMOVING A REGION FORMED OF SILICON OXIDE AND PLASMA PROCESSING APPARATUS

CROSS-REFERENCE TO RELATED APPLICATIONS

This application is based on and claims priority from Japanese Patent Application Nos. 2013-180267 and 2013-256118 filed on Aug. 30, 2013 and Dec. 11, 2013, respectively, with the Japan Patent Office, the disclosures of which are incorporated herein in their entireties by reference.

TECHNICAL FIELD

Exemplary embodiments of the present disclosure relate to a method of selectively removing a region formed of silicon oxide and a plasma processing apparatus.

BACKGROUND

In manufacturing semiconductor devices, some regions of a workpiece are selectively removed in some cases. A kind of a workpiece, which is subjected to such a processing, includes a first region formed of silicon oxide and a second region formed of silicon. A processing of selectively removing the first region from such a workpiece is disclosed in Japanese National Phase Patent Laid-Open Publication No. 2007-515074.

In the processing disclosed in Japanese National Phase Patent Laid-Open Publication No. 2007-515074, $(NH_4)_2SiF_6$ is produced by a reaction of HF and $NH_3$ and silicon oxide in the first region. That is, some regions including a surface of the first region are denatured by the reaction. In addition, when the workpiece is heated, denatured $(NH_4)_2SiF_6$ is thermally decomposed. In the processing disclosed in Japanese National Phase Patent Laid-Open Publication No. 2007-515074, the region formed of silicon oxide is selectively removed through denaturation and thermal decomposition.

Recently, attempts have been made to perform a processing in which the processing disclosed in Japanese National Phase Patent Laid-Open Publication No. 2007-515074, i.e., the selective removal by denaturation and thermal decomposition is performed using plasma. For example, Japanese Patent Laid-Open Publication No. 2008-16869 discloses a processing in which a region formed of silicon oxide is denatured by plasma of a gas containing $H_2$, $N_2$, and $NF_3$, and the denatured region is removed by thermal decomposition. In addition, Japanese National Phase Patent Laid-Open Publication No. 2013-503482 discloses a processing in which a carbon-containing film is denatured by plasma of a gas containing $NH_3$ and $NF_3$, and a denatured region is removed by thermal decomposition.

SUMMARY

In a first aspect, a method of selectively removing a first region from a workpiece is provided in which the workpiece includes the first region formed of silicon oxide and a second region formed of silicon. The method performs a plurality of sequences. Each of the sequences includes: forming a denatured region by generating plasma of a processing gas that contains hydrogen, nitrogen, and fluorine within a processing container that accommodates the workpiece so as to denature a portion of the first region, and removing the denatured region within the processing container. In addition, a sequence subsequent to a predetermined number of sequences after a first sequence among the plurality of sequences further includes exposing the workpiece to plasma of a reducing gas which is generated within the processing container, prior to the forming of the denatured region.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
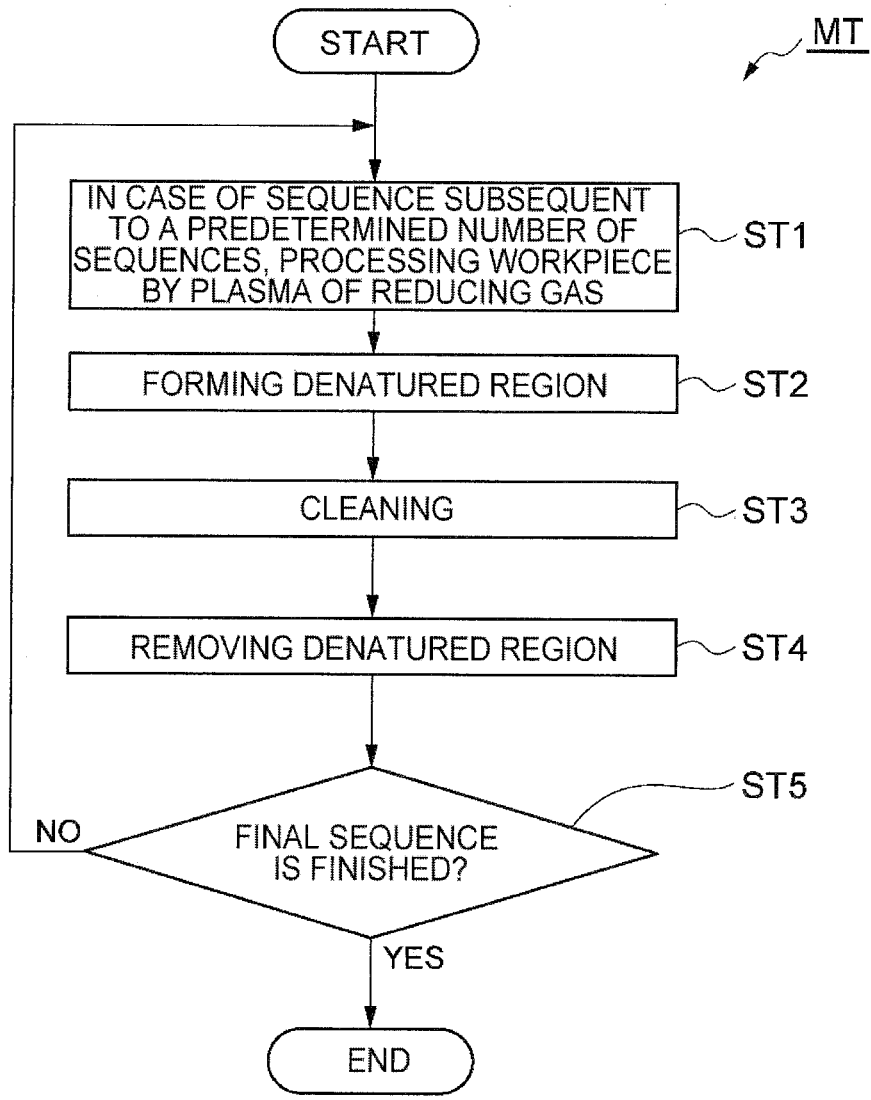
FIG. 1 is a flowchart illustrating an exemplary embodiment of a method MT of selectively removing a region formed of silicon oxide.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the above-described processing of Japanese Patent Laid-Open Publication No. 2008-16869, not only the first region formed of silicon oxide but also a second region formed of silicon may be partially cut. Accordingly, in the related technical field, it is requested that selectivity of removing a region formed of silicon oxide be improved.

When the first region formed of silicon oxide is denatured, oxygen is produced from the first region, and the second region formed of silicon is oxidized to form an oxidized region. Accordingly, when the first region is denatured, the oxidized region is also denatured, and also removed by the subsequent processing. Various aspects and types to be discussed below are to improve selectivity of removing a region formed of silicon oxide by suppressing generation of such an oxidized region.

In a first aspect, a method of selectively removing a first region from a workpiece is provided in which the workpiece includes the first region formed of silicon oxide and a second region formed of silicon. The method performs a plurality of sequences. Each of the sequences includes: (a) forming a denatured region by generating plasma of a processing gas that contains hydrogen, nitrogen, and fluorine within a processing container that accommodates the workpiece so as to denature a portion of the first region, and (b) removing the denatured region within the processing container. In addition, a sequence subsequent to a predetermined number of sequences after a first sequence among the plurality of sequences further includes exposing the workpiece to plasma of a reducing gas which is generated within the processing container prior to the forming of the denatured region.

In the method according to the first aspect, an oxidized region generated as a portion of the second region is oxidized in step (a) in the sequence is exposed to the plasma of the reducing gas and reduced prior to performing step (a) of the next sequence. Accordingly, a portion of the second region may be suppressed from being removed. As a result, the selectivity of removing the region formed of silicon oxide may be improved.

In the step (b) of removing the denatured region in an exemplary embodiment, the workpiece may be heated within the processing container. In the present exemplary embodiment, the denatured region is removed by thermal decomposition in step (b).

In step (b) of removing the denatured region in an exemplary embodiment, the workpiece may be exposed to the plasma of the rare gas which is generated within the processing container. In the present exemplary embodiment, the denatured region is separated from the first region by the plasma of the rare gas. Hereinafter, step (b) of this exemplary embodiment may be referred to as "step b1".

In step (b) of removing the denatured region in another exemplary embodiment, the workpiece may be exposed to reactive plasma generated within the processing container. In the present exemplary embodiment, the denatured region may be separated from the first region by the reactive plasma.

A method of an exemplary embodiment may further include (c) cleaning an inside of the processing container after taking out the workpiece from the processing container, between step (a) of forming of the denatured region and step (b1) of removing of the denatured region. Just after step (a), fluorine may remain within the processing container. Accordingly, when step (b1) is continuously performed following step (a), the second region may be cut by the plasma of fluorine. However, in the present exemplary embodiment, since the inside of the processing container is cleaned between step (a) and step (b1), the second region may be suppressed from being cut by the plasma of fluorine. Meanwhile, cleaning may be performed by supplying the rare gas into the processing container, exciting the rare gas, and exhausting the inside of the processing container. In addition, the cleaning may be performed using, for example, plasma including $O_2$.

In an exemplary embodiment, the second region may be buried in the first region in the workpiece at an initial state. The method of the present exemplary embodiment may further include exposing the workpiece to plasma of a fluorocarbon-based gas within the processing container. The plurality of sequences may be performed after the exposing of the workpiece to the plasma of the fluorocarbon-based gas. According to the present exemplary embodiment, the first region may be removed at a high speed by the plasma of the fluorocarbon-based gas, for example, until it is requested that the first region be selectively removed in relation to the second region.

In an exemplary embodiment, the second region may form a fin region of a fin type field effect transistor. When manufacturing a fin type field effect transistor, a plurality of convex fin regions are buried in the first region formed of silicon oxide, and it is necessary to expose the fin regions through etching-back. In the etching-back, it is necessary to selectively remove the first region in relation to the fin regions. The methods of above-described aspects and exemplary embodiments may be adopted in, for example, the etching-back.

In an exemplary embodiment, the processing gas may include $N_2$ gas as a nitrogen source. In addition, the processing gas may include $H_2$ gas as a hydrogen source. Further, the processing gas may include at least one of $SF_6$ gas, $NF_3$ gas, fluorocarbon gas, fluorohydrocarbon gas as a fluorine source.

In addition, in an exemplary embodiment, the above-described method may be performed in a plasma processing apparatus which is provided with the processing container and uses microwaves as a plasma source. In the plasma processing apparatus which uses the microwaves as the plasma source, plasma with a high density may be generated and the workpiece may be processed in a non-bias manner. Accordingly, the first region may be selectively removed while suppressing the second region from being cut by an ion sputtering effect.

In an exemplary embodiment, in step (a), the pressure within the processing container may be set to be in a range of 40 Pa (300 mTorr) to 66.66 Pa (500 mTorr). In addition, in an exemplary embodiment, in step (a), the processing gas may include $N_2$ gas, and a flow rate of the $N_2$ gas may be set to be in a range of 300 sccm to 1000 sccm. In addition, in an exemplary embodiment, in step (a), the processing gas may include $SF_6$ gas, and a ratio occupied by a ratio of the $SF_6$ gas in an entire range of the processing gas may be set to be in a range of 3% to 8%. According to these exemplary embodiments, the speed of selectively removing the first region may increase. In addition, in an exemplary embodiment, in step (a), the microwave power may be set to be in a range of 800 W to 3000 W. According to this exemplary embodiment, when the workpiece includes a plurality of patterns of different densities, not only uniformity in speed of removing the silicon oxide in the patterns may be improved, but also micro-loading may be controlled.

In second and third aspects, plasma processing apparatuses are provided which may be used for carrying out the methods of the first aspect and various exemplary embodiments as described above.

A plasma processing apparatus according to the second aspect includes a processing container, a mounting table, a gas supply unit, a plasma generation unit, and a control unit. The mounting table is provided so as to place a workpiece thereon within the processing container. The mounting table includes a temperature control mechanism. The gas supply unit supplies a processing gas containing hydrogen, nitrogen, and fluorine, and a reducing gas into the processing container. The plasma generation unit generates energy for exciting a gas supplied into the processing container. The control unit controls the temperature control mechanism, the gas supply unit, and the plasma generation unit. The control unit performs a plurality of sequences. Each sequence includes a first control of causing the gas supply unit to supply the processing gas and causing the plasma generation unit to generate the energy, and a second control of causing the temperature control mechanism to heat the mounting table. In addition, the control unit performs a third control of causing the gas supply unit to supply the reducing gas and causing the plasma generation unit to generate the energy, prior to the first control in a sequence subsequent to a predetermined number of sequences after a first sequence among the plurality of sequences. According to this plasma processing apparatus, the first region formed of silicon oxide may be denatured to form a denatured region, and the denatured region may be removed by thermal decomposition.

A plasma processing apparatus according to the third aspect also includes a processing container, a mounting table, a gas supply unit, a plasma generation unit, and a control unit. The mounting table is provided so as to place a workpiece thereon within the processing container. The gas supply unit supplies a processing gas containing hydrogen, nitrogen, and fluorine, a rare gas, and a reducing gas into the processing container. The plasma generation unit generates energy for exciting a gas supplied into the processing container. The control unit controls the gas supply unit and the plasma generation unit. The control unit performs a plurality of sequences. Each sequence includes a first control of causing the gas supply unit to supply the processing gas and causing the plasma generation unit to generate the energy, and a second control of causing the gas supply unit to supply the rare gas and the plasma generation unit to generate the energy. In addition, the control unit performs a third control of causing the gas supply unit to supply the reducing gas and causing the plasma generation unit to generate the energy, prior to the first control in a sequence subsequent to a predetermined number of sequences after a first sequence among the plurality of sequences. According to this plasma processing apparatus, a denatured region is separated from the first region by the plasma of the rare gas.

In an exemplary embodiment, the control unit of the plasma processing apparatus may perform a control of cleaning an inside of the processing container between the first control and the second control.

In an exemplary embodiment, in the first control, a control may be performed such that no bias power is supplied to the mounting table.

In an exemplary embodiment, the gas supply unit may further supply a fluorocarbon-based gas into the processing container. Prior to the plurality of sequences, the control unit may further perform a fourth control of causing the gas supply unit to supply the fluorocarbon-based gas and of causing the plasma generation unit to generate the energy.

In an exemplary embodiment, the plasma generation unit may introduce microwaves into the processing container as the energy. In an exemplary embodiment, in the first control, the control unit may set a pressure within the processing container to be in a range of 40 Pa to 66.66 Pa. In addition, in an exemplary embodiment, in the first control, the control unit may set a power of the microwaves to be in a range of 800 W to 3000 W. In addition, in an exemplary embodiment, the processing gas may include $N_2$ gas, and in the first control, the control unit may set a flow rate of the $N_2$ gas to be in a range of 300 sccm to 1000 sccm. Further, in an exemplary embodiment, the processing gas may include $SF_6$ gas, and in the first control, the control unit may set a ratio occupied by a flow rate of the $SF_6$ gas in an entire flow rate of the processing gas to be in a range of 3% to 8%.

In a fourth aspect, a method of selectively removing a first region from a workpiece is provided in which the workpiece includes the first region formed of silicon oxide and a second region formed of silicon. In the workpiece, the second region is buried in the first region. The method includes: (i) generating plasma of a fluorocarbon-based gas within a processing container in which the workpiece is accommodated and exposing the work piece to the fluorocarbon-based gas so as to expose the second region from the first region; (j) generating plasma of a processing gas containing hydrogen, nitrogen, and fluorine within the processing container to denature the first region so as to form a denatured region; and (k) removing the denatured region within the processing container. According to the method of the fourth aspect, the first region may be removed in a high speed by step (i) and, a remainder of the first region remaining after the step may be selectively removed. In an exemplary embodiment, the second region may form a fin region in a fin type field effect transistor.

In step (k) in an exemplary embodiment, the workpiece may be heated within the processing container. Alternatively, in step (k) in an exemplary embodiment, the workpiece may be exposed to the plasma of the rare gas generated within the processing container. Hereinafter, step (k) of removing the denatured region by the plasma of the rare gas may be referred to as "step (k1)".

In an exemplary embodiment, the method may further include (m) cleaning the inside of the processing container after taking out the workpiece from the processing container between step (j) and step (k1). According to this exemplary embodiment, the second region may be suppressed from being cut by the plasma of fluorine remaining after step (j).

In an exemplary embodiment, the processing gas may include $N_2$ gas as a nitrogen source. In addition, the processing gas may include $H_2$ gas as a hydrogen source. Further, the processing gas may include at least one of $SF_6$ gas, $NF_3$ gas, fluorocarbon gas, and fluorohydrocarbon gas as a fluorine source.

In an exemplary embodiment, the method may be carried out in a plasma processing apparatus which includes the processing container and uses the microwaves as a plasma source. In the plasma processing apparatus which uses the microwaves as the plasma source, plasma with a high density may be generated and the workpiece may be processed in a non-bias manner. Accordingly, the first region may be selectively removed while suppressing the second region from being cut by an ion sputtering effect.

In an exemplary embodiment, in step (j), the pressure within the processing container may be set to be in a range of 40 Pa (300 mTorr) to 66.66 Pa (500 mTorr). In addition, in an exemplary embodiment, in step (j), the processing gas may include $N_2$ gas, and a flow rate of the $N_2$ gas may be set to be in a range of 300 sccm to 1000 sccm. In addition, in an exemplary embodiment, in step (j), the processing gas may include $SF_6$ gas, and a ratio occupied by a ratio of the $SF_6$ gas in an entire range of the processing gas may be set to be in a range of 3% to 8%. According to these exemplary embodiments, the speed of selectively removing the first region may increase. In addition, in an exemplary embodiment, in step (j), the microwave power may be set to be in a range of 800 W to 3000 W. According to this exemplary embodiment, when the workpiece includes a plurality of patterns of different densities, not only uniformity in speed of removing the silicon oxide in the patterns may be improved, but also micro-loading may be controlled.

In fifth and sixth aspects, plasma processing apparatuses are provided which may be used for carrying out the methods of the third aspect and various exemplary embodiments as described above.

A plasma processing apparatus according to the fifth aspect includes a processing container, a mounting table, a gas supply unit, a plasma generation unit, and a control unit. The mounting table is provided so as to place a workpiece thereon within the processing container. The mounting table includes a temperature control. The gas supply unit supplies a processing gas containing hydrogen, nitrogen, and fluorine, and a fluorocarbon-based gas into the processing container. The plasma generation unit generates energy for exciting a gas supplied into the processing container. The control unit controls the temperature control mechanism, the gas supply unit, and the plasma generation unit. The control unit performs a first control of causing the gas supply unit to supply the fluorocarbon-based gas and causing the plasma generation unit to generate the energy, a second control of causing the gas supply unit to supply the processing gas and causing the plasma generation unit to generate the energy, and a third control of causing the temperature control mechanism to heat the mounting table. According to the plasma processing apparatus of the fifth aspect, when heating is performed in removing the denatured region, the method of the fourth aspect may be carried out.

A plasma processing apparatus according to the sixth aspect also includes a processing container, a mounting table, a gas supply unit, a plasma generation unit, and a control unit. The mounting table is provided so as to place a workpiece thereon within the processing container. The gas supply unit supplies a processing gas containing hydrogen, nitrogen, and fluorine, a rare gas, and a fluorocarbon-based gas into the processing container. The plasma generation unit generates energy for exciting a gas supplied into the processing container. The control unit performs a first control of causing the gas supply unit to supply the fluorocarbon-based gas and causing the plasma generation unit to generate the energy, a second control of causing the gas supply unit to supply the processing gas and causing the plasma generation unit to generate the energy, and a third control of causing the gas supply unit to supply the rare gas and causing the plasma generation unit to generate the energy. According to the plasma processing apparatus of the sixth aspect, when the plasma of the rare gas is generated so as to remove the denatured region, the method of the fourth aspect may be carried out.

In an exemplary embodiment, the control unit of the plasma processing apparatus may perform a control of cleaning the inside of the processing container between the second control and the third control.

In an exemplary embodiment, the second control may be performed such that no bias power may be supplied to the mounting table.

In an exemplary embodiment, the plasma generation unit may introduce microwaves into the processing container as the energy. In an exemplary embodiment, in the second control, the control unit may set a pressure within the processing container to be in a range of 40 Pa to 66.66 Pa. In addition, in an exemplary embodiment, in the second control the control unit may set a power of the microwaves to be in a range of 800 W to 3000 W. In addition, in an exemplary embodiment, the processing gas may include $N_2$ gas, and in the second control, the control unit may set a flow rate of the $N_2$ gas to be in a range of 300 sccm to 1000 sccm. Further, in an exemplary embodiment, the processing gas may include $SF_6$ gas, and in the second control, the control unit may set a ratio occupied by a flow rate of the $SF_6$ gas in an entire flow rate of the processing gas to be in a range of 3% to 8%.

As described above, it is possible to improve selectivity of removing a region formed of silicon oxide.

Hereinafter, various exemplary embodiments will be described in detail with reference to accompanying drawings. Meanwhile, like elements in respective drawings will be denoted by like reference numerals.

FIG. 1 is a flowchart illustrating an exemplary embodiment of a method MT of selectively removing a region formed of silicon oxide. The method MT illustrated in FIG. 1 may be used so as to selectively remove the first region formed of silicon oxide from a workpiece (hereinafter, referred to as a "wafer") W.

Figure 2:
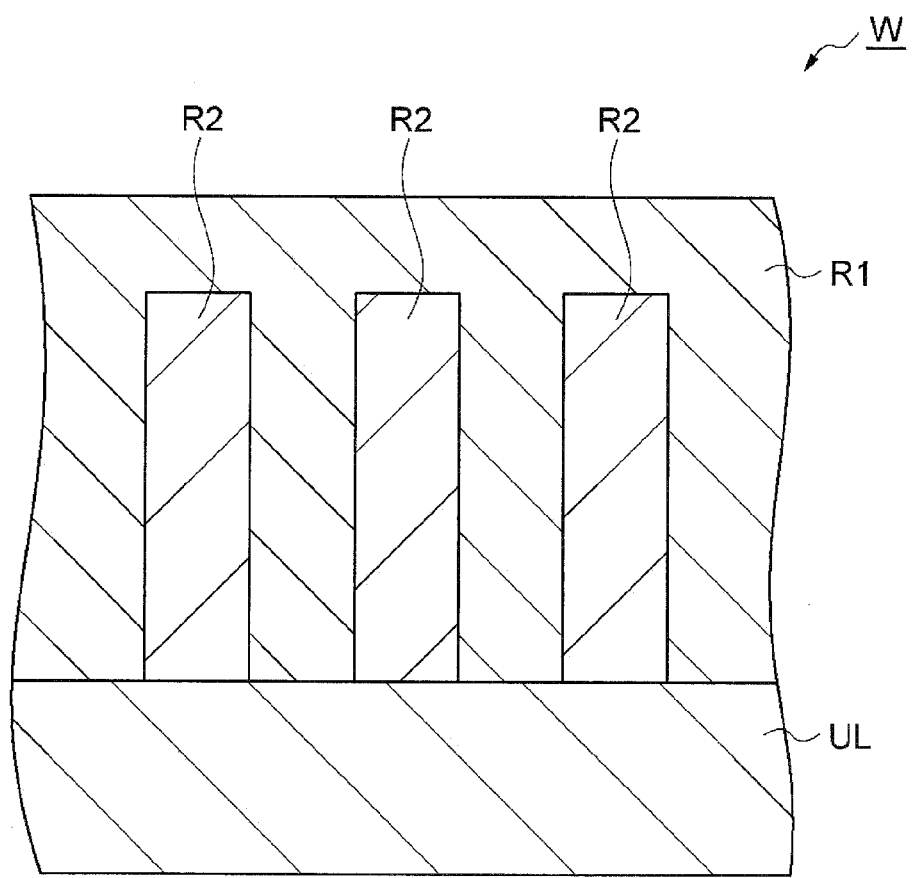
FIG. 2 is a cross-sectional view illustrating an exemplary workpiece.

FIG. 2 is a cross-sectional view illustrating an exemplary workpiece. A workpiece which is an object to be processed by the method MT, i.e., a wafer W includes a first region R1 and a second region R2. The first region R1 is a region formed of a silicon oxide, for example, $SiO_2$. The second region R2 is a region formed of silicon, for example, polysilicon.

As an example, the method MT may be used so as to selectively remove a region formed of silicon oxide formed to cover a fin region of a fin type field effect transistor. As illustrated in FIG. 2, a plurality of second regions R2 is formed in the wafer W of this example to constitute fin regions on an underlayer UL. The second regions R2 have a substantially rectangular parallelepiped shape and are arranged to be substantially parallel to each other. In addition, in the wafer W, the first region R1 is formed to cover the second regions R2. Hereinafter, the method MT will be described again with reference to FIG. 1, taking etching-back that removes the first region R1 which covers the second regions R2 serving as fin regions, as an example. Meanwhile, the method MT is not limited to the etching-back and may be applied to any workpiece that requires selective removal of a region formed of the silicon oxide.

As illustrated in FIG. 1, a plurality of sequences is performed in the method MT. Each sequence includes step ST2 and step ST4. In addition, in the method MT, in a sequence subsequent to a predetermined number of sequences after the first sequence, step ST1 is performed prior to step ST2. In an exemplary embodiment, each sequence may further include step ST3.

Figure 3:
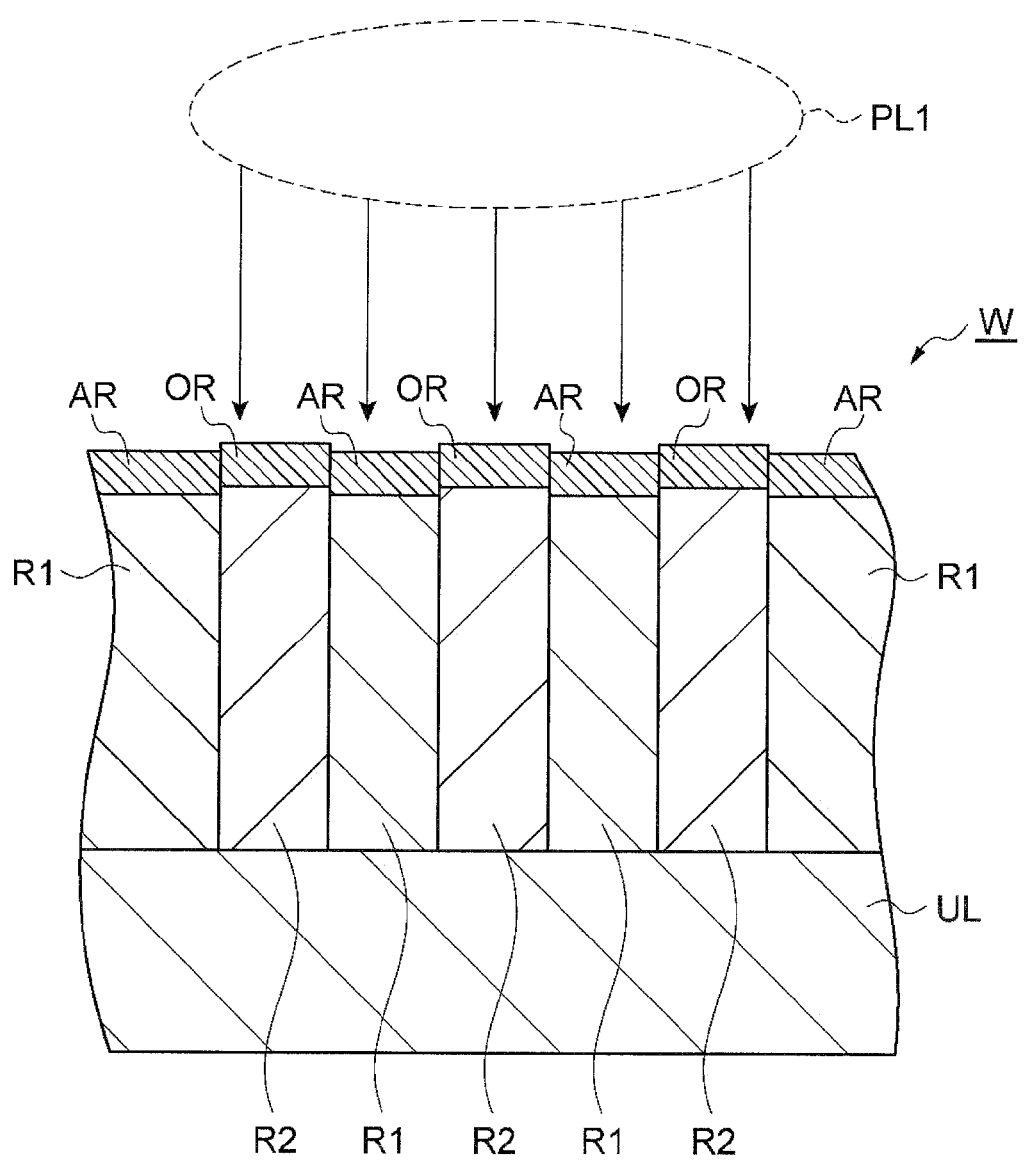
FIG. 3 is a view for describing step ST2 of the method MT.

FIG. 3 is a view for describing step ST2. FIG. 3 illustrates a state in which a top side portion of the first region R1 is removed from the initial wafer W illustrated in FIG. 2 and head portions of the second regions R2 are exposed. In step ST2, plasma PL1 of a processing gas containing hydrogen, nitrogen, and fluorine is generated within a processing container in which the wafer W is accommodated, and the wafer W is exposed to the plasma PL1. A portion of the first region R1, i.e., a partial region including a surface of the first region R1 is denatured by step ST2 to form a denatured region AR. Specifically, since hydrogen, nitrogen, and fluorine are contained in the processing gas, the silicon oxide of the first region R1 is denatured to $(NH_4)_2SiF_6$, i.e., ammonium silicon fluoride.

In an exemplary embodiment, the processing gas may include $H_2$ gas as a hydrogen source and $N_2$ gas as a nitrogen source. In addition, the processing gas may include at least one of fluorocarbon gas, fluorohydrocarbon gas, $NF_3$ gas, and $SF_6$ gas, as a fluorine source. As for the fluorocarbon gas, $CF_4$ gas, $C_4F_8$ gas, $C_5F_8$ gas, and $C_4F_6$ gas may be exemplified. In addition, as for the fluorohydrocarbon gas, $CHF_3$ gas, $CH_2F_2$ gas, and $CH_3F$ gas may be exemplified.

In step ST2, the plasma of the processing gas may be generated by an arbitrary plasma source. For example, the processing gas may be excited by microwaves, by a capacitive coupling type plasma source, or by an inductive coupling type plasma source. In addition, in step ST2, a bias power for drawing ions in the plasma to the wafer W may not be used. That is, step ST2 may be performed in a non-bias state. When the step ST2 is performed in the non-bias state, the damage of the wafer W by an ion sputtering effect may be suppressed.

As described above, since the processing gas containing fluorine is used in step ST2, the fluorine may remain within the processing container just after step ST2. Thus, in the method MT of an exemplary embodiment, step ST3 is performed following step ST2. In step ST3, the wafer W is taken out from the processing container, and a cleaning of the inside of the processing container is performed. In an exemplary embodiment, in step ST3, a rare gas such as, for example, Ar gas, is supplied into the processing container and excited. In addition, the cleaning may also be performed using, for example, plasma including $O_2$. Since the fluorine is removed from the inside of the processing container by step ST3, the second regions R2 may be suppressed from being cut by activated species of fluorine in the subsequent step ST4.

Figure 4:
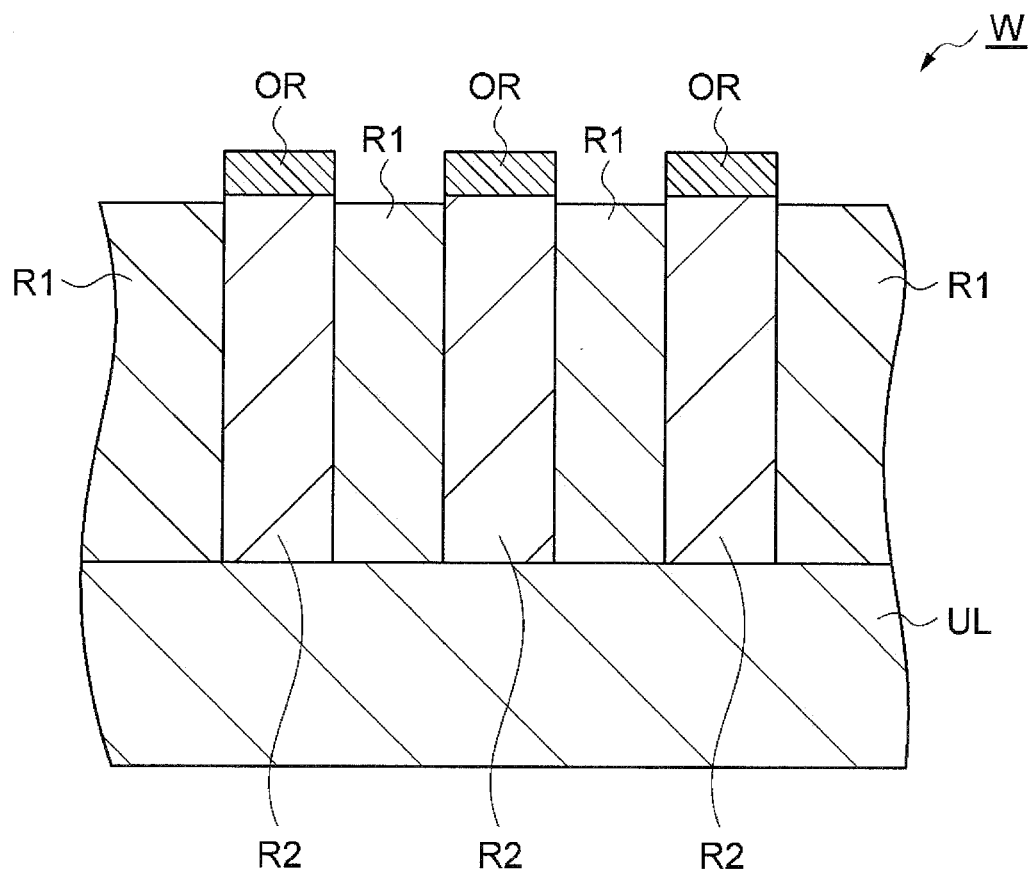
FIG. 4 is a view illustrating a state of a wafer after step ST4 of the method MT.

Subsequently, in the method MT, the wafer W is returned back to the processing container to be subjected to step ST4. In step ST4, the denatured region AR is removed, i.e., etched. Meanwhile, when step ST3 is not performed, step ST4 is performed following step ST2 without taking out the wafer W from the processing container. In step ST4 in an exemplary embodiment, the wafer W is heated in the processing container. As a result, the denatured region AR is thermally decomposed and thus the denatured region AR is removed as illustrated in FIG. 4. In an exemplary embodiment, the wafer W is heated by heating the mounting table supporting the wafer W within the processing container using a temperature adjustment mechanism installed in the mounting table. For example, the wafer W will be heated to a temperature of, for example, 80° C. or higher. As the temperature of the wafer W becomes higher, a time required for removing the denatured region AR would become shorter. Accordingly, the wafer W may be heated to a temperature of 120° C.

In step ST4 of another exemplary embodiment, plasma of a rare gas such as, for example, Ar gas, is generated within the processing container, and the wafer W is exposed to the plasma. As a result, the denatured region AR is removed as illustrated in FIG. 4. Meanwhile, in step ST4, the plasma may be generated by any plasma source. For example, the plasma may be generated by microwaves, by a capacitive coupling type plasma source, or by an inductive coupling type plasma source. In addition, in step ST4, a bias power for drawing ions in the plasma to the wafer W may not be used. That is, step ST4 may be performed in a non-bias state. When step ST4 is performed in the non-bias state, the damage of the wafer W by an ion sputtering effect is suppressed.

Subsequently, in the method MT, in step ST5, it is determined whether the final sequence is terminated. When it is determined that the final sequence is terminated, the method MT is terminated. Meanwhile, when the final sequence is not terminated, the next sequence is performed.

Reference will be made to FIG. 3 again. As illustrated in FIG. 3, when the second regions R2 are exposed on the surface of the wafer W while step ST2 is performed, oxygen is produced from the first region R1 by the processing of step ST2. Some regions including the surfaces of the second regions R2 are oxidized to form oxidized regions OR. The oxidized regions OR remains even after step ST4 as illustrated in FIG. 4. Accordingly, as illustrated in FIG. 1, in the method MT, step ST1 is performed in a sequence subsequent to a predetermined number of sequences after the first sequence. In step ST1, a reducing processing is performed on the oxidized regions OR. Meanwhile, the wording, "sequence subsequent to a predetermined number of sequences," refers to a sequence at least excluding the first sequence among a plurality of sequences, for example, the second or later sequence. In addition, the wording, "sequence subsequent to a predetermined number of sequences" may be one or more sequences performed just after a sequence in which the second regions R2 are initially exposed to the plasma generated by step ST2.

Figure 5:
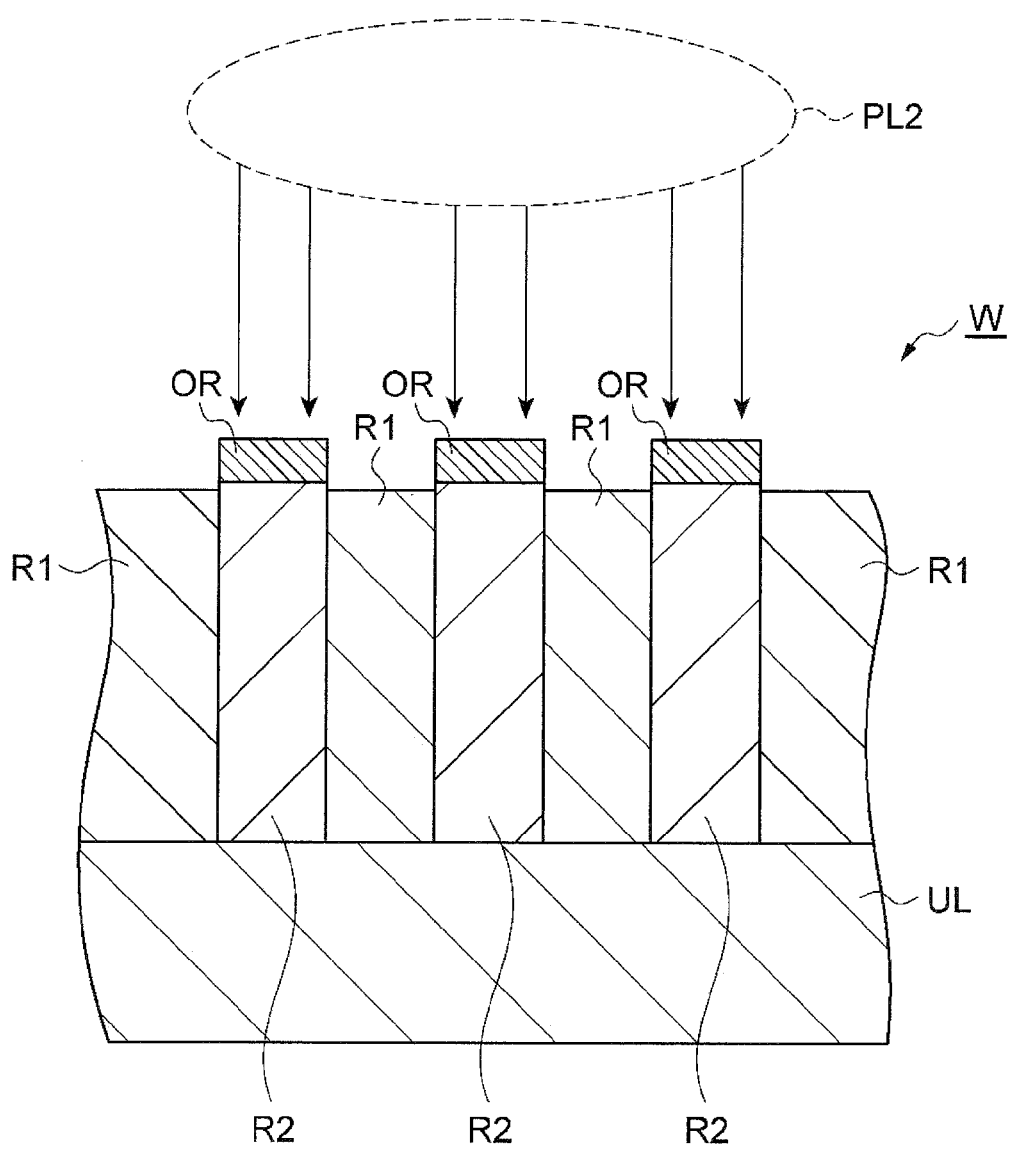
FIG. 5 is a view for describing step ST1 of the method MT.
Figure 6:
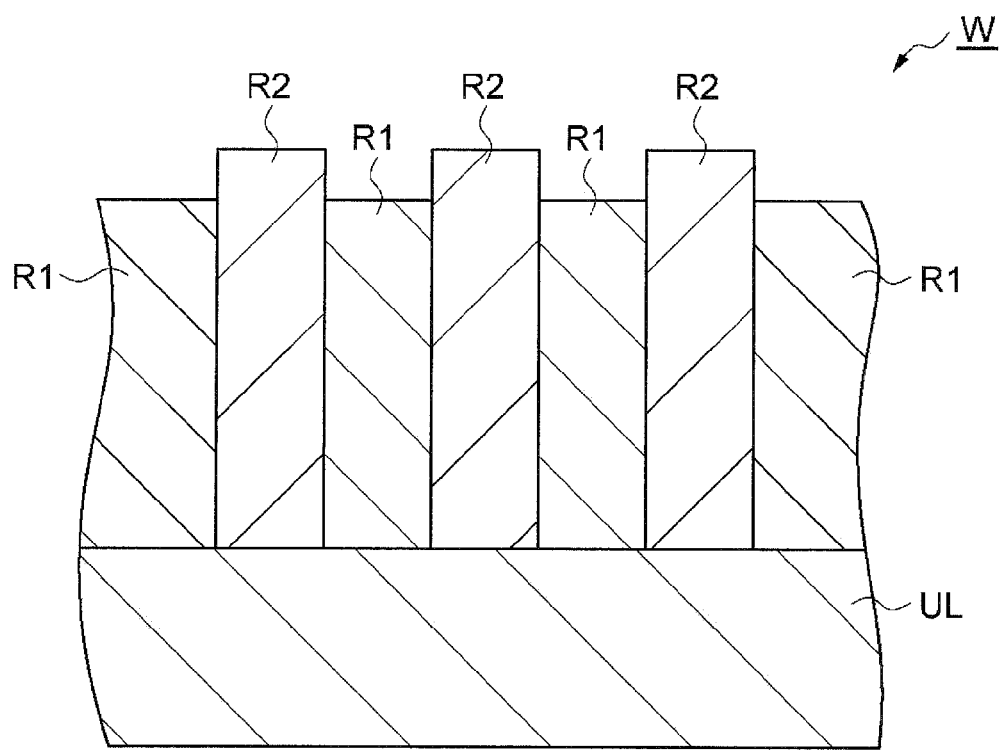
FIG. 6 is a view illustrating a state of the wafer after step ST1 of the method MT.

FIG. 5 is a view for describing step ST1. In step ST1, plasma PL2 of the reducing gas is generated within the processing container. The reducing gas may include, for example, $H_2$ gas. As for the reducing gas, a mixed gas of $H_2$ gas and $N_2$ gas may be considered. In step ST1, the wafer W is exposed to the plasma PL2 of the reducing gas so that the oxidized regions OR are reduced. As a result, as illustrated in FIG. 6, the oxidized regions OR become some of the second regions R2 formed of silicon.

Meanwhile, in step ST1, the plasma may be generated by any plasma source. For example, the plasma may be generated using microwaves, generated by a capacitive coupling type plasma source, or generated by an inductive coupling type plasma source. In addition, in step ST1, a bias power for drawing ions in the plasma to the wafer W may not be used. That is, step ST1 may not be performed in a non-bias state. When step ST1 is performed in the non-bias state, damage of the wafer W by an ion sputtering effect may be suppressed.

Figure 7:
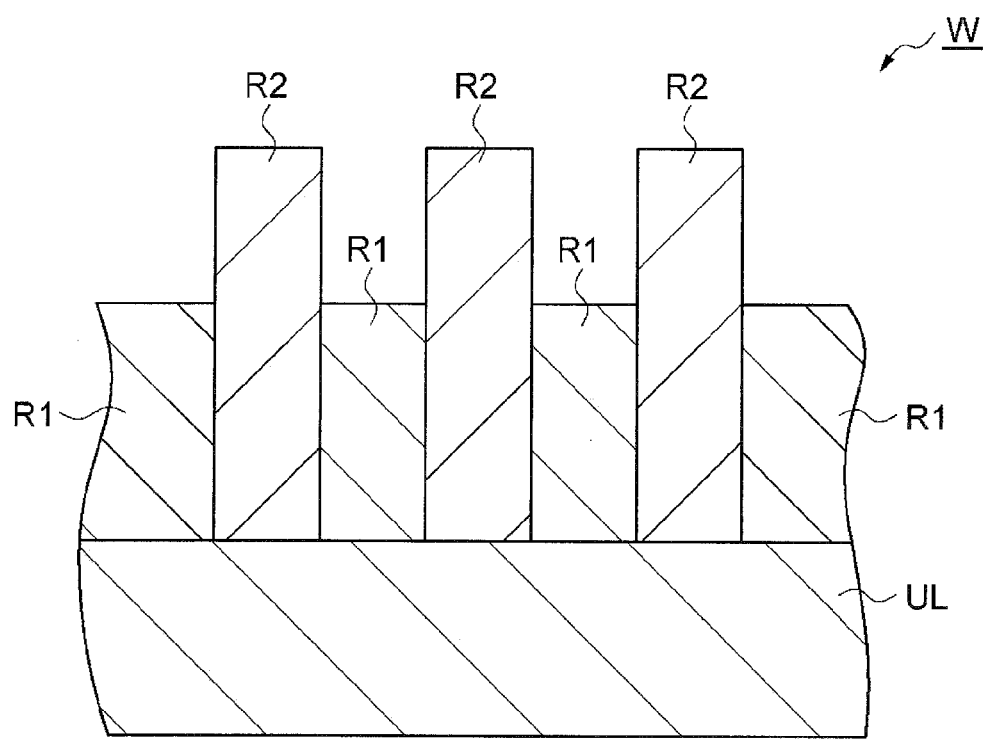
FIG. 7 is a view illustrating a state of the wafer after being subjected to the processing of the method MT.

When the sequence including steps ST1 to ST4 is performed multiple times in the method MT as described above, first regions R1 are selectively removed with respect to the second regions R2, as illustrated in FIG. 7. As an example, the first regions R1 are selectively etched back with respect to the second regions R2 which are fin regions.

Hereinafter, descriptions will be made on another exemplary embodiment of the method of selectively removing a region formed of silicon oxide. In the other exemplary embodiment, a step of exposing a wafer W to plasma of a fluorocarbon-based gas is performed until it becomes necessary to selectively remove the first region R1 with respect to the second region R2. That is, the plurality of sequences illustrated in FIG. 1 is performed after the step of exposing the wafer W to the plasma of the fluorocarbon-based gas.

The fluorocarbon-based gas may include at least one of the above-described fluorocarbon gas and fluorohydrocarbon gas, and may further include another gas such as, for example, a rare gas. In addition, in the step of exposing the wafer W to the fluorocarbon-based gas, the plasma may be generated by any plasma source. For example, the plasma may be generated using microwaves, may be generated by a capacitive coupling type plasma source, or may be generated by an inductive coupling type plasma source. In addition, in the step of exposing the wafer W to the plasma of the fluorocarbon-based gas, a bias power for drawing ions in the plasma to the wafer W may be used.

Figure 8:
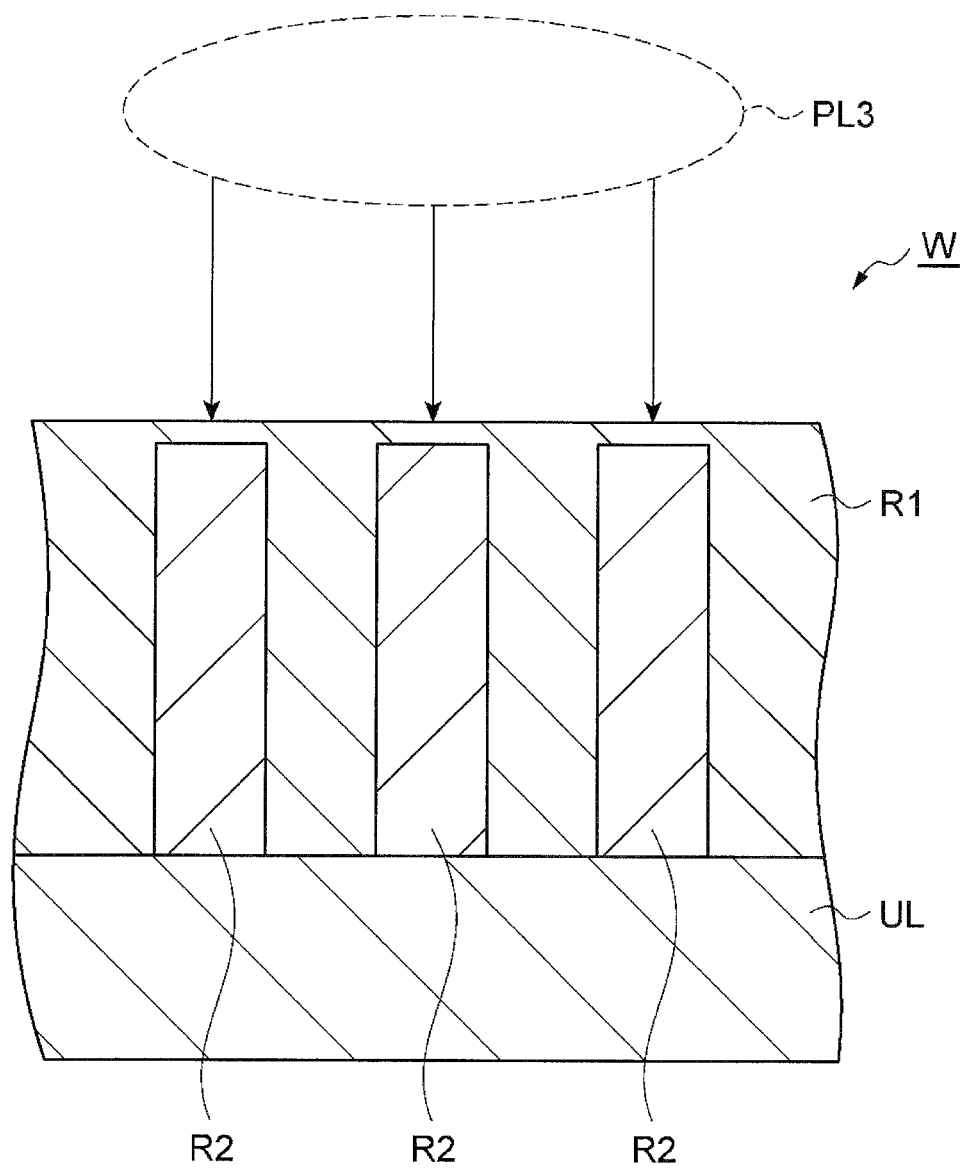
FIG. 8 is a view for describing the step of exposing a wafer W to plasma of a fluorocarbon-based gas.

FIG. 8 is a view for describing a step of exposing a wafer W to a fluorocarbon-based gas. As illustrated in FIG. 8, plasma PL3 of the fluorocarbon-based gas is generated in the processing container in the step of exposing the wafer W to the plasma PL3 of the fluorocarbon-based gas. When the wafer W is exposed to the plasma PL3, the first region R1 is etched. As an example, the step of exposing the wafer W to the plasma of the fluorocarbon-based gas may be performed until the head portions of the second regions R2 are exposed or immediately before the head portions of the second regions R2 are exposed, as illustrated in FIG. 8. Thus, the first region R1 may be removed at a high speed. In addition, when the plurality of sequences illustrated in FIG. 1 is performed thereafter, the first region R1 may be selectively removed with respect to the second regions R2.

Figure 9:
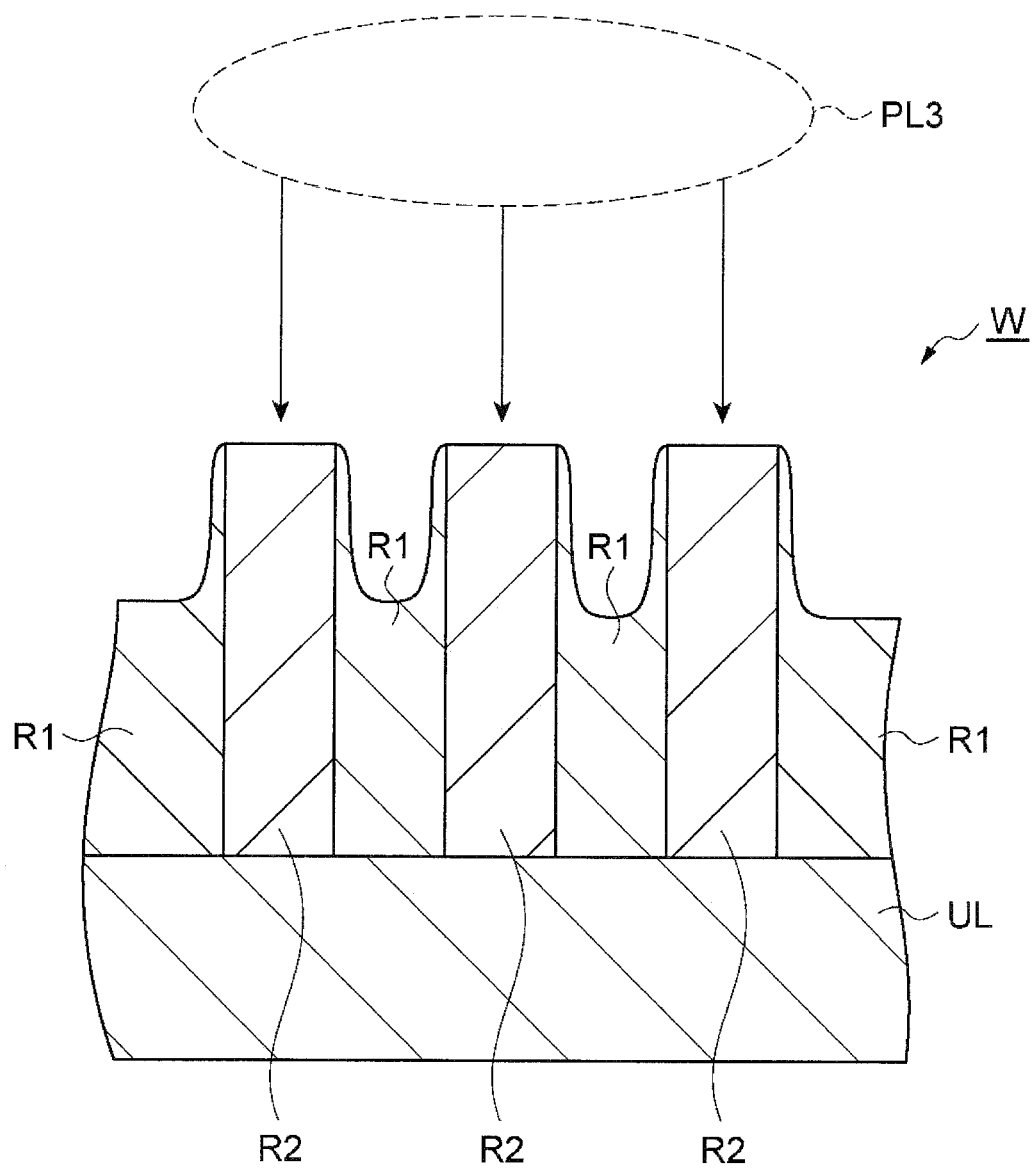
FIG. 9 is an exemplary state of the wafer W just after the step of exposing the wafer W to the plasma of the fluorocarbon-based gas.

FIG. 9 illustrates an exemplary wafer state just after the step of exposing the wafer W to plasma of a fluorocarbon-based gas. The step of exposing the wafer W to plasma of the fluorocarbon-based gas may be performed until the first region R1 partially remains along the side walls of the second regions R2 as illustrated in FIG. 9. Thereafter, the plurality of sequences illustrated in FIG. 1 may be performed in order to remove the first region R1 remaining along the side walls.

Figure 10:
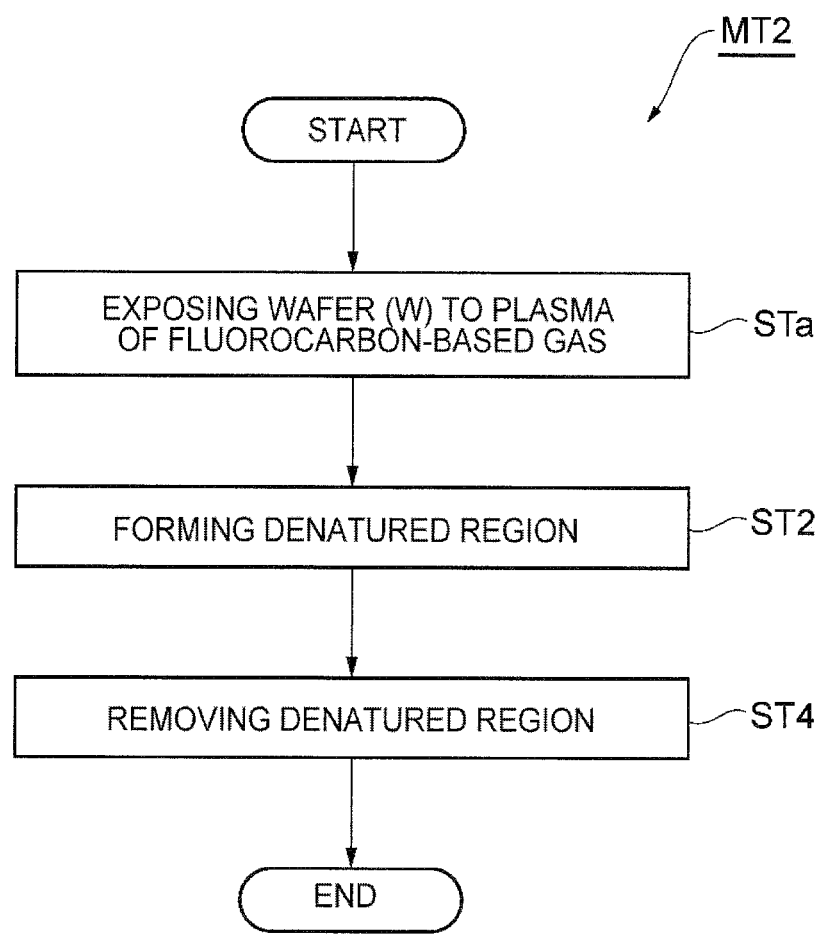
FIG. 10 is a flowchart illustrating another exemplary embodiment of a method MT2 of selectively removing a region formed of silicon oxide.

Subsequently, descriptions will be made on still another exemplary embodiment of the method of selectively removing a region formed of silicon oxide. FIG. 10 is a flowchart illustrating still another exemplary embodiment of the method of selectively removing a region formed of silicon oxide. The method MT2 illustrated in FIG. 10 includes step STa of exposing a wafer W to plasma of a fluorocarbon-based gas, and steps ST2 and ST4 described above.

Figure 11:
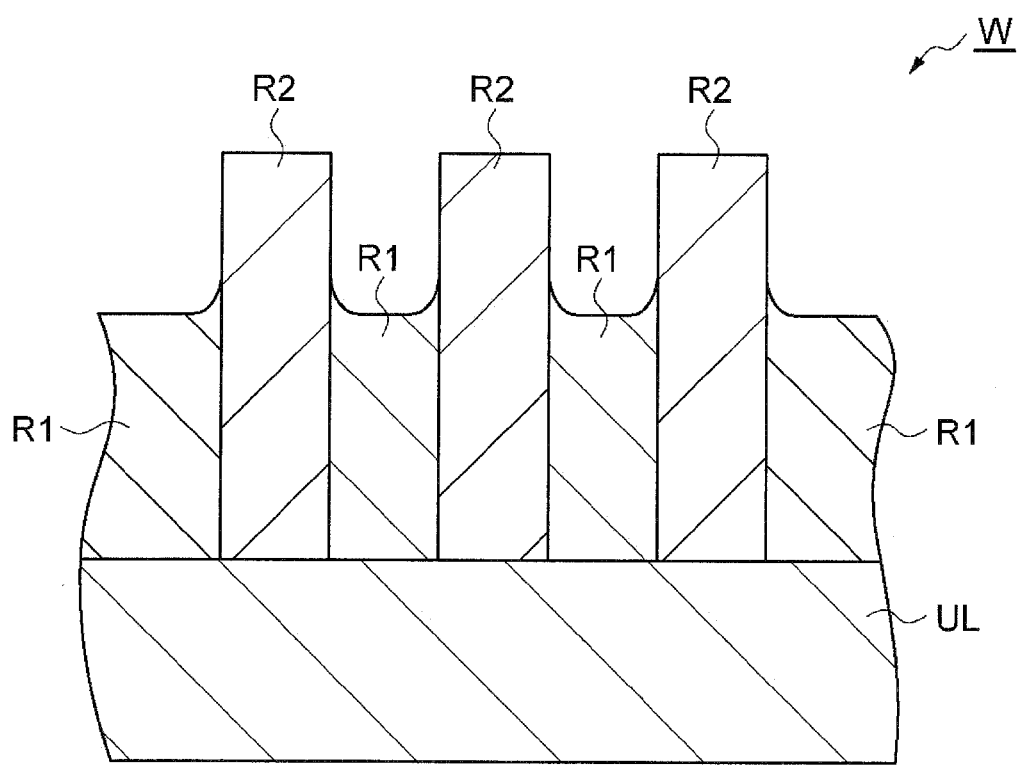
FIG. 11 is a view illustrating a state of a wafer after step STa of the method MT2.

In step STa of the method MT2, the plasma PL3 of the fluorocarbon-based gas is generated in the processing container as described above with reference to FIG. 8. When the wafer W illustrated in FIG. 2 is exposed to the plasma PL3, the first region R1 is etched. That is, in step STa, the first region R1 is etched back by the plasma PL3 of the fluorocarbon-based gas. After step STa is terminated, the height in the thickness direction of the first region R1 partially increases at the areas along the side walls of the second regions R2 as illustrated in FIG. 11. That is, the first region R1 takes a long tail shape from each of the side walls of the second regions R2.

Figure 12:
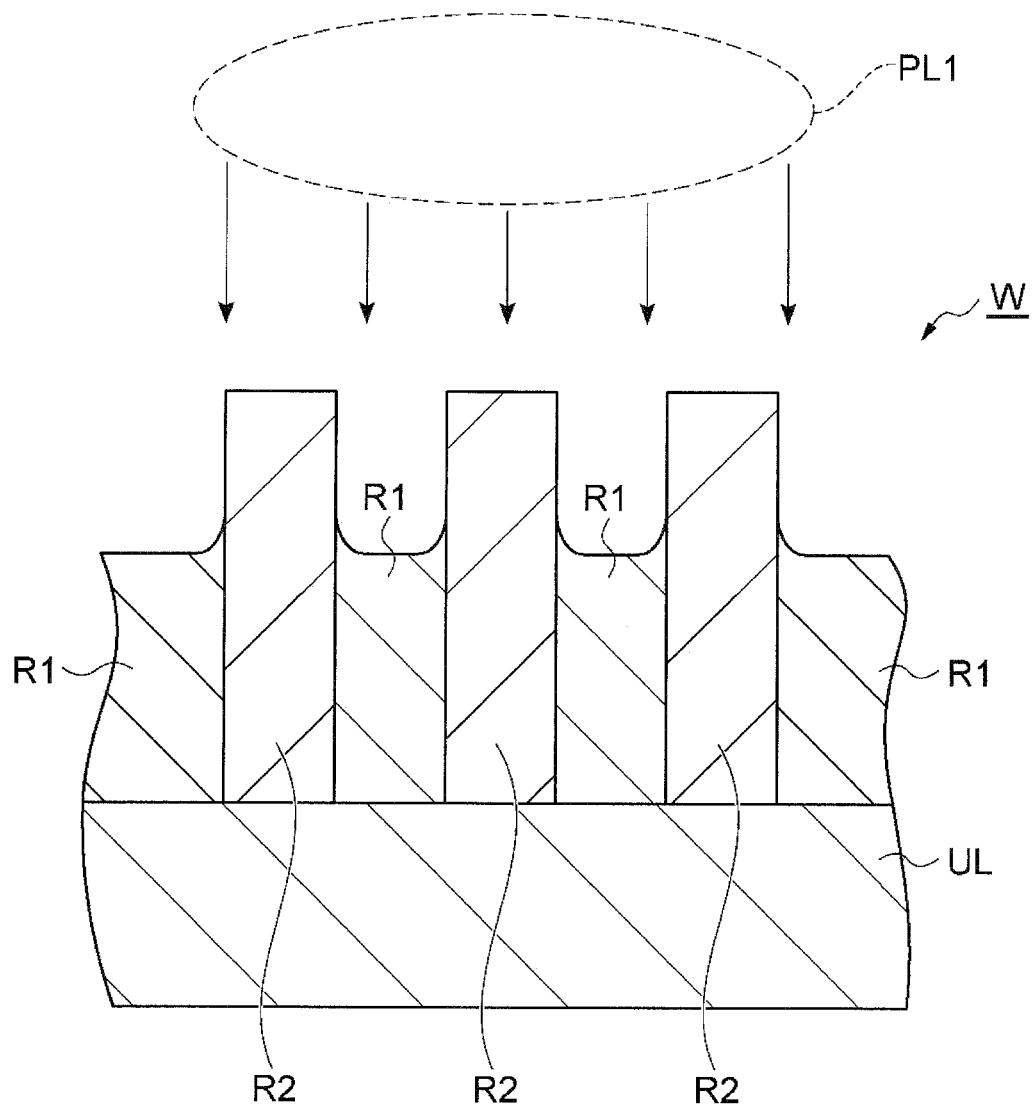
FIG. 12 is a view for describing step ST of the method MT2.

Subsequently, the above-described step ST2 is performed in the method MT2. That is, in step ST2, as illustrated in FIG. 12, plasma PL1 of a processing gas containing hydrogen, nitrogen, and fluorine is generated within the processing container that accommodates the wafer W, and the wafer W is exposed to the plasma PL1. As a result, some regions including a portion of the first region R1, i.e., the surface of the first region R1 is denatured.

Figure 13:
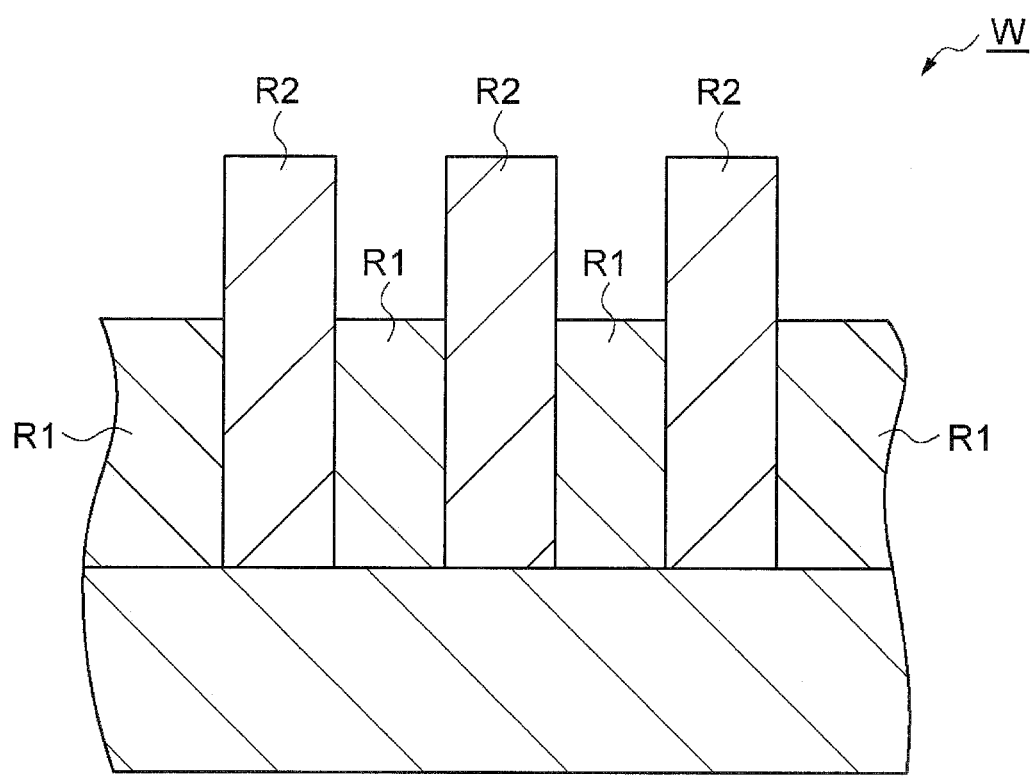
FIG. 13 is a view illustrating a state of the wafer after step ST4 of the method MT2.

Subsequently, the above-described step ST4 is performed in the method MT2. That is, in step ST4, the denatured region produced in step ST2 is removed. By step ST4, the surface of the first region R1 becomes relatively flat surface as illustrated in FIG. 13. As described above, in step ST4, the denatured region produced in step ST2 may be removed by heating the wafer W within the processing container. Alternatively, in step ST4, the plasma of the rare gas may be generated within the processing container and the wafer W may be exposed to the plasma so as to remove the denatured region. In addition, step ST4 may be performed in a non-bias state.

According to the method MT2, the surface of the first region R1 etched back in step STa may be processed to a relatively flat surface by performing step ST2 and step ST4 following step STa. In addition, according to the method MT2, a series of steps including steps STa, ST2, and ST4 may be performed within a single processing container, i.e., using a single plasma processing apparatus. Meanwhile, also in the step MT2, step ST3 may be performed between steps ST2 and ST4. In addition, in the method MT2, the plasma may be generated by any plasma source. For example, when the plasma is excited by microwaves, the first region R1 between adjacent fins may be etched back by step STa without following a pitch between multiple fins which correspond to the second regions R2.

Figure 14:
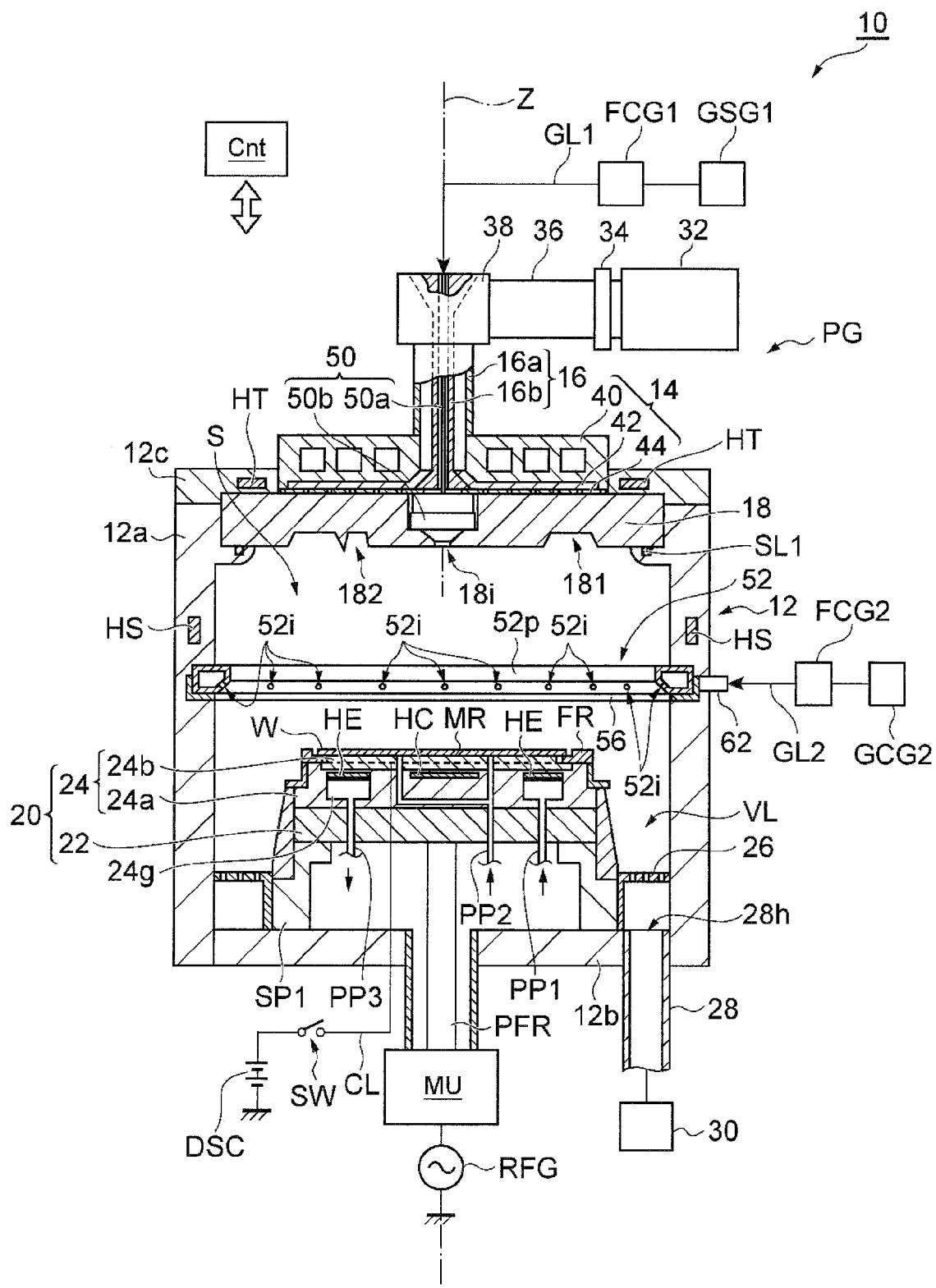
FIG. 14 is a cross-sectional view schematically illustrating a plasma processing apparatus according to an exemplary embodiment.

Hereinafter, descriptions will be made on a plasma processing apparatus capable of being used for carrying out the above-described methods of various exemplary embodiments. FIG. 14 is a cross-sectional view schematically illustrating a plasma processing apparatus.

The plasma processing apparatus 10 illustrated in FIG. 14 is provided with a processing container 12. The processing container 12 defines a processing space S configured to accommodate a wafer W. The processing container 12 may include a side wall 12a, a bottom 12b, and a ceiling 12c.

The side wall 12a has a substantially cylindrical shape centering substantially around an axis Z and extending in a direction in which the axis Z extends (hereinafter, referred to as an "axis Z direction"). The inner diameter of the side wall 12a is, for example, 540 mm. The bottom 12b is formed at the lower end side of the side wall 12a. The top end of the side wall 12a is opened. The opening at the top end of the side wall 12a is closed by a dielectric window 18. The dielectric window 18 is sandwiched between the top end of the side wall 12a and the ceiling 12c. A sealing member SL1 may be interposed between the dielectric window 18 and the top end of the side wall 12a. The sealing member SL1 is, for example, an O-ring and contributes to the sealing of the processing container 12.

The plasma processing apparatus 10 is further provided with a mounting table 20. The mounting table 20 is installed within the processing container 12 and below the dielectric window 18. The mounting table 20 includes a plate 22 and an electrostatic chuck 24.

The plate 22 is a substantially disc-shaped metallic member and is formed of, for example, aluminum. The plate 22 is supported by a cylindrical support SP1. The support SP1 extends vertically upward from the bottom 12b. The plate 22 also serves as a high frequency electrode. The plate 22 is electrically connected to a high frequency power source RFG configured to generate a high frequency bias power, through a matching unit MU and a power feeding rod PFR. The high frequency power source RFG outputs a high frequency bias power having a predetermined frequency suitable for controlling energy of ions drawn into the wafer W, for example, 13.65 MHz. The matching unit MU accommodates a matcher configured to match impedance between the high frequency power source RFG side impedance and a load (mainly, such as, for example, an electrode, plasma, and the processing container 12) side impedance. A blocking condenser for self-bias generation is included within the matching unit.

An electrostatic chuck 24 is installed on the top surface of the plate 22. The electrostatic chuck 24 includes a base plate 24a and a chuck portion 24b. The base plate 24a is a substantially disc-shaped metallic member, and is formed of, for example, aluminum. The base plate 24a is installed on the plate 22. The chuck portion 24b is installed on the top surface of the base plate 24a. The top surface of the chuck portion 24b becomes a mounting region MR configured to mount a wafer W thereon. The chuck portion 24b holds the wafer W with an electrostatic attractive force. The chuck portion 24b includes an electrode film sandwiched between dielectric films. A direct current power source DSC is electrically connected to the electrode film of the chuck portion 24b through a switch SW and a coated wire CL. The chuck portion 24b may attract and hold the wafer W on the top surface thereof by a coulomb force generated by a direct voltage applied to the direct current power source DSC. A focus ring FR is provided radially outside of the chuck portion 24b to annularly surround an edge of the wafer W.

In addition, the plasma processing apparatus 10 is provided with a temperature control mechanism. An annular coolant chamber 24g extending in a circumferential direction is installed inside the base plate 24a as a portion of the temperature control mechanism. A coolant of a predetermined temperature, for example, cooling water is circulated and supplied to the coolant chamber 24g from a chiller unit through pipes PP1, PP3. The processing temperature of the wafer W on the chuck portion 24b may be controlled depending on the temperature of the coolant. In addition, a heat transfer gas from a heat transfer gas supply unit, for example, He gas is supplied to a gap between the top surface of the chuck portion 24b and the rear surface of the wafer W through a gas supply tube PP2.

In addition, the plasma processing apparatus 10 may be further provided with heaters HT, HS, HC, and HE as a portion of the temperature control mechanism. The heater HT is installed within the ceiling 12c, and extends annularly to surround the antenna 14. In addition, the heater HS is installed within the side wall 12a and extends annularly. The heater HC is installed within the base plate 24a. The heater HC is installed below a central portion of the above-described mounting region MR within the base plate 24a, i.e., in a region intersecting the axis Z. In addition, the heater HE is installed within the base plate 24a and extends annularly to surround the heater HC. The heater HE is installed below an outer peripheral portion of the above-described mounting region MR.

In addition, an annular exhaust passage VL is formed around the mounting table 20. An annular baffle plate 26 formed with a plurality of through holes is installed in the middle of the exhaust passage VL in the axis Z direction. The exhaust passage VL is connected to an exhaust tube 28 that provides an exhaust port 28h. The exhaust tube 28 is attached to the bottom 12b of the processing container 12. An exhaust apparatus 30 is connected to the exhaust tube 28. The exhaust apparatus 30 includes a pressure regulator and a vacuum pump, for example, a turbo molecular pump. The processing space S within the processing container 12 may be decompressed to a desired vacuum degree by the exhaust apparatus 30. In addition, when the exhaust apparatus 30 is operated, gas may be exhausted from the outer circumference of the mounting table 20 through the exhaust passage VL.

In addition, the plasma processing apparatus 10 is further provided with a plasma generation unit PG of an exemplary embodiment. The plasma generation unit PG includes an antenna 14, a coaxial waveguide 16, a dielectric window 18, a microwave generator 32, a tuner 34, a waveguide 36, and a mode converter 38. The microwave generator 32 generates microwaves of, for example, a 2.45 GHz frequency. The microwave generator 32 is connected to an upper portion of a coaxial waveguide 16 through the tuner 34, the waveguide 36, and the mode converter 38. The coaxial waveguide 16 extends along the axis Z which is the central axis thereof. In an exemplary embodiment, the center of the mounting region MR of the mounting table 20 is positioned on the axis Z.

The coaxial waveguide 16 includes an outer conductor 16a and an inner conductor 16b. The outer conductor 16a has a cylindrical shape extending along the axis Z which is the central axis thereof. The lower end of the outer conductor 16a may be electrically connected to an upper portion of a cooling jacket 40 having a conductive surface. The inner conductor 16b is installed inside the outer conductor 16a coaxially to the outer conductor 16a. The inner conductor 16b has a cylindrical shape extending along the axis Z which is the central axis thereof. The lower end of the inner conductor 16b is connected to the slot plate 44 of the antenna 14.

In an exemplary embodiment, the antenna 14 is a radial line slot antenna. The antenna 14 is placed inside the opening formed in the ceiling 12c, and installed on the top surface of the dielectric window 18. The antenna 14 includes a dielectric plate 42 and a slot plate 44. The dielectric plate 42 shortens the wavelength of microwaves and has substantially a disc shape. The dielectric plate 42 is formed of, for example, quartz or alumina. The dielectric plate 42 is sandwiched between the slot plate 44 and a lower surface of the cooling jacket 40. Accordingly, the antenna 14 may be configured by the dielectric plate 42, the slot plate 44, and the cooling jacket 40.

Figure 15:
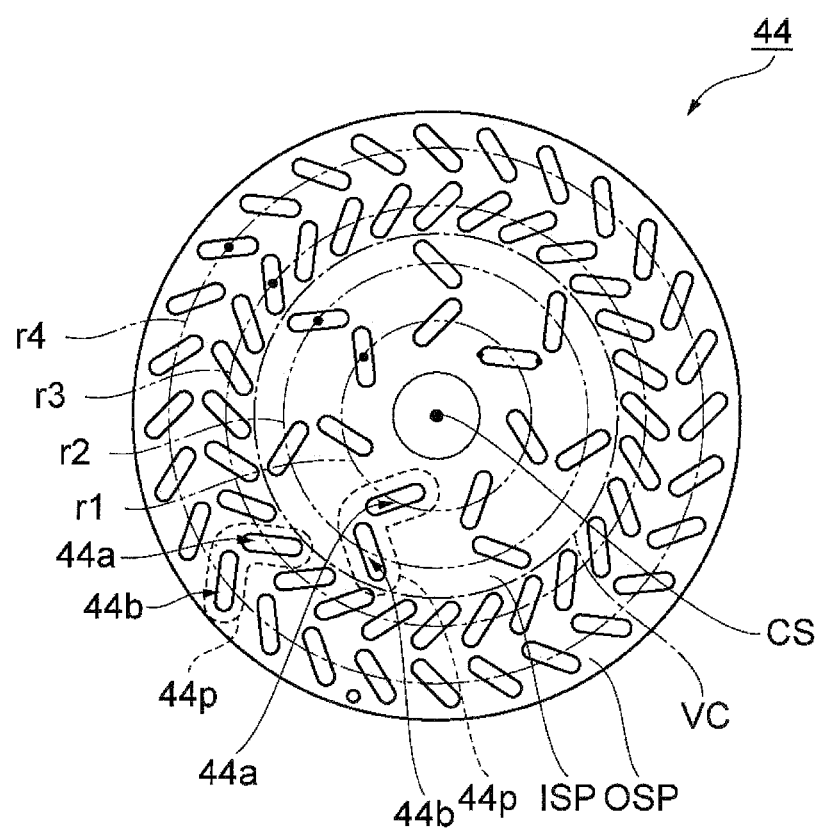
FIG. 15 is a bottom plan view illustrating an exemplary slot plate.

FIG. 15 is a plan view illustrating an exemplary slot plate. The slot plate 44 is a thin plate type and is disc-shaped. The both sides of the slot plate 44 in the thickness direction are parallel to each other. The center CS of the circular slot plate 44 is positioned on the axis Z. A plurality of slot pairs 44p is provided in the slot plate 44. Each of the plurality of slot pairs 44p includes two slot holes 44a, 44b penetrating the slot plate 44 in the thickness direction. The planar shape of each of the slot holes 44a, 44b has an elongated hole shape. In each slot pair 44p, a major axis direction of the slot hole 44a and a major axis direction of the slot hole 44b intersect or are orthogonal to each other.

In the example illustrated in FIG. 15, the plurality of slot pairs 44p is classified into an inner slot pair group ISP provided inside a virtual circle VC around the axis Z and an outer slot pair group OSP provided outside the virtual circle VC. The inner slot pair group ISP includes a plurality of slot pairs 44p. In the example illustrated in FIG. 15, the inner slot pair group ISP includes seven (7) slot pairs 44p. The plurality of slot pairs 44p of the inner slot pair group ISP is arranged at regular intervals in a circumferential direction with respect to the center CS. The plurality of slot holes 44a included in the inner slot pair group ISP is arranged at regular intervals such that the centers of gravity of the slot holes 44a are positioned on a circle having a radius r1 from the center CS of the slot plate 44. In addition, the plurality of slot holes 44b included in the inner slot pair group ISP is arranged at regular intervals such that the centers of gravity of the slot holes 44b are positioned on a circle having a radius r2 from the center CS of the slot plate 44. Here, the radius r2 is larger than the radius r1.

The outer slot pair group OSP includes a plurality of slot pairs 44p. In the example illustrated in FIG. 15, the outer slot pair group OSP includes twenty eight (28) slot pairs 44p. The plurality of slot pairs 44p of the outer slot pair group OSP is arranged at regular intervals in the circumferential direction with respect to the center CS. The plurality of slot holes 44a included in the outer slot pair group OSP is arranged at regular intervals such that the centers of gravity of the slot holes 44a are positioned on a circle having a radius r3 from the center CS of the slot plate 44. In addition, the plurality of slot holes 44b included in the outer slot pair group OSP are arranged at regular intervals such that the centers of gravity of slot holes 44b is positioned on a circle having a radius r4 from the center CS of the slot plate 44. Here, the radius r3 is larger than the radius r2 and the radius r4 is larger than the radius r3.

In addition, respective slot holes 44a of the inner slot pair group ISP and the outer slot pair group OSP are formed such that the major axes thereof have the same angle with respect to segments connecting the center CS and the centers of gravity thereof. In addition, the slot holes 44b of the inner slot pair group ISP and the outer slot pair group OSP are formed such that the major axes thereof have the same angle with respect to segments connecting the center CS and the centers of gravity thereof.

Figure 16:
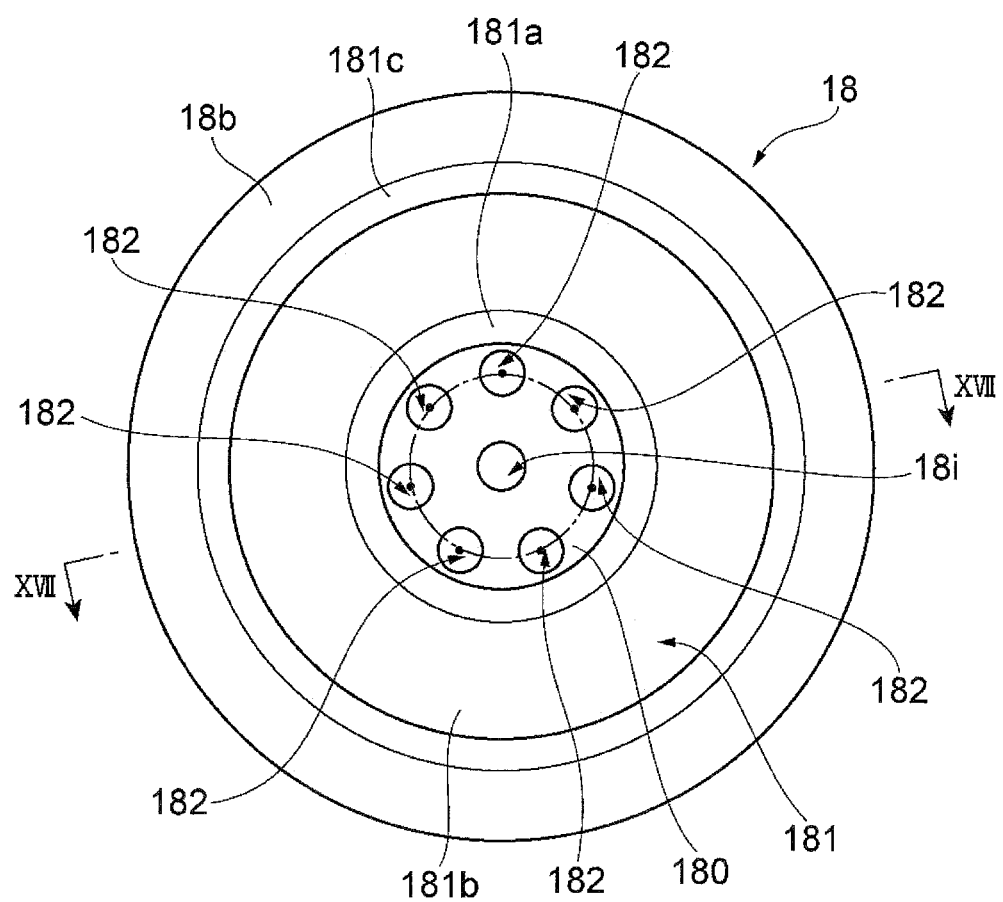
FIG. 16 is a bottom plan view illustrating an exemplary dielectric window.
Figure 17:
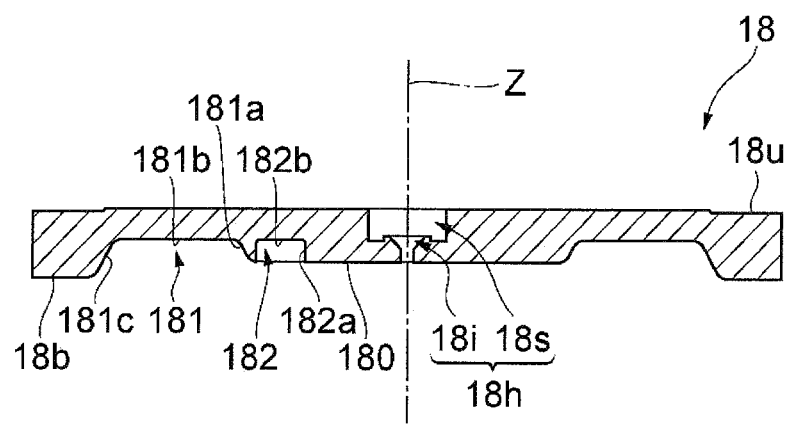
FIG. 17 is a cross-sectional view taken along line XVII-XVII of FIG. 16.

FIG. 16 is a plan view illustrating an exemplary dielectric window in which a state of the dielectric window viewed from the processing space S side is illustrated. FIG. 17 is a cross-sectional view taken along line XVII-XVII of FIG. 16. The dielectric window 18 has substantially a disc shape and formed of a dielectric material such as, for example, quartz or alumina. The slot plate 44 is installed on the upper surface 18u of the dielectric window 18.

A through hole 18h is formed at a central portion of the dielectric window 18. An upper portion of the through hole 18h provides a space 18s to accommodate an injector 50b of a central introduction unit 50, and a lower portion is a central introduction port 18i of the central introduction unit 50. The central introduction unit 50 will be described below. The central axis of the dielectric window 18 coincides with the axis Z.

A surface opposite to the upper surface 18u of the dielectric window, i.e., the lower surface 18b faces the processing space S and becomes a surface at the plasma generation side. The lower surface 18b defines various shapes. Specifically, the lower surface 18b includes a flat surface 180 in a central region surrounding the central introduction port 18i. The flat surface 180 is a flat surface orthogonal to the axis Z. The lower surface 18b is annually continued in a region radially outside the flat surface 180 to define a first annular concave portion 181 recessed in a tapered shape toward the inside of the dielectric window 18 in the plate thickness direction.

The first concave portion 181 is defined by an inner tapered surface 181a, a bottom surface 181b, and an outer tapered surface 181c. The bottom surface 181b is formed closer to the upper surface 18u side than the flat surface 180 and extends annularly to be parallel to the flat surface 180. The inner tapered surface 181a extends annularly between the flat surface 180 and the bottom surface 181b and is inclined in relation to the flat surface 180. The outer tapered surface 181c extends annularly between the bottom surface 181b and the peripheral edge of the lower surface 18b and is inclined in relation to the bottom surface 181b. Meanwhile, the peripheral edge region of the lower surface 18b becomes a surface which is in contact with the side wall 12a.

In addition, the lower surface 18b defines a plurality of second concave portions 182 which is recessed from the flat surface 180 toward the inside of the dielectric window 18 in the plate thickness direction. The number of the second concave portions 182 is seven in the example illustrated in FIGS. 16 and 17. The plurality of second concave portions 182 is formed at regular intervals along the circumferential direction. In addition, the plurality of second concave portions 182 has a circular plane shape in a plane orthogonal to the axis Z. Specifically, the inner surface 182a defining the second concave portions 182 is a cylindrical surface extending in the axis Z direction. Further, the bottom surface 182b defining the second concave portions 182 is formed closer to the upper surface 18u side than the flat surface 180 and is a circular surface parallel to the flat surface 180.

Figure 18:
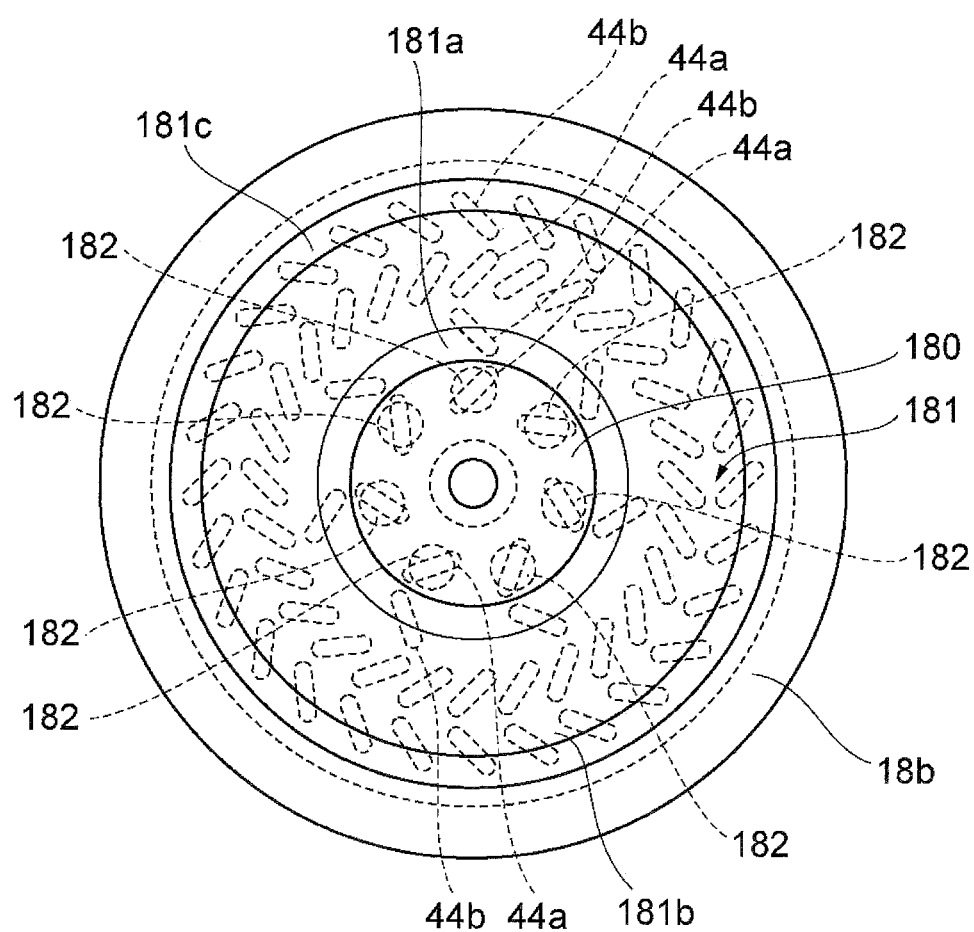
FIG. 18 is a bottom plan view illustrating a state in which the slot plate illustrated in FIG. 15 is installed above the dielectric window illustrated in FIG. 16.

FIG. 18 is a bottom plan view illustrating a state where the slot plate illustrated in FIG. 15 is placed above the dielectric window illustrated in FIG. 16 in which the dielectric window 18 is viewed from the bottom side. When viewed in the bottom plan view as illustrated in FIG. 18, i.e., when viewed in the axis Z direction, the plurality of slot holes 44a and the plurality of slot holes 44b of the outer slot pair group OSP and the plurality of slot holes 44b of the inner slot pair group ISP overlap with the first concave portion 181. Specifically, when viewed in the bottom plan view, the plurality of slot holes 44b of the outer slot pair group OSP partially overlaps with outer tapered surface 181c and partially overlaps the bottom surface 181b. In addition, when viewed in the bottom plan view, the plurality of slot holes 44a of the outer slot pair group OSP overlaps with the bottom surface 181b. Further, when viewed in the bottom plan view, the plurality of slot holes 44b of the inner slot pair group ISP partially overlaps with the inner tapered surface 181a and partially overlaps with the bottom surface 181b.

In addition, when viewed in the bottom plan view, that is, when viewed in the axis Z direction, the plurality of slot holes 44a of the inner slot pair group ISP overlaps with the second concave portions 182. Specifically, when viewed in the bottom plan view, each of centers of gravity (center) of the bottom surfaces of the plurality of second concave portions 182 are positioned within the plurality of slot holes 44a of the inner slot pair group ISP, respectively.

Reference will be again made to FIG. 14. In the plasma processing apparatus 10, microwaves generated by the microwave generator 32 are propagated to the dielectric plate 42 through the coaxial waveguide 16 and provided to the dielectric window 18 from the slot holes 44a and 44b of the slot plate 44.

In the dielectric window 18, as described above, the plate thickness of the portion defining the first concave portion 181 and the plate thickness of the portion defining the second concave portions 182 are thinner than the other portion. Accordingly, in the dielectric window 18, the microwave transmissibility becomes higher at the portion defining the first concave portion 181 and the portion defining the second concave portions 182. In addition, when viewed in the axis Z direction, the slot holes 44a and 44b of the outer slot pair group OSP and the slot holes 44b of the inner slot pair group ISP overlap with the first concave portion 181, and the slot holes 44a of the inner slot pair group ISP overlap with the second concave portion 182. Accordingly, electric fields of microwaves are concentrated to the first concave portion 181 and the second concave portions 182, and the energy of the microwaves is concentrated to the first concave portion 181 and the second concave portions 182. As a result, plasma may be stably generated in the first concave portion 181 and the second concave portions 182 so that plasma distributed in the radial direction and circumferential direction can be stably generated just below the dielectric window 18.

In addition, the plasma processing apparatus 10 further include a central introduction unit 50 and a peripheral introduction unit 52. The central introduction unit 50 includes a duct 50a, an injector 50b, and a central introduction port 18i. The duct 50a is configured to pass through a bore inside the inner conductor 16b of the coaxial waveguide 16. In addition, an end of the duct 50a extends to the inside of the space 18s (see, for example, FIG. 17) defined along the axis Z by the dielectric window 18. The injector 50b is accommodated inside the space 18s and below the end of the duct 50a. In the injector 50b, a plurality of through holes is formed to extend in the axis Z direction. Further, the dielectric window 18 defines the central introduction port 18i. The central introduction port 18i is continued downward from the space 18s and extends along the axis Z. The central introduction unit 50 with this configuration supplies a gas to the injector 50b through the duct 50a so that the gas is injected from the injector 50b through the central introduction port 18i. In this manner, the central introduction unit 50 injects the gas to an area just below the dielectric window 18 along the axis Z. That is, the central introduction unit 50 introduces the gas into a plasma generation region with a high electron temperature.

The peripheral introduction unit 52 includes a plurality of peripheral introduction ports 52i. The plurality of peripheral introduction ports 52i mainly provides the gas to an edge region of a wafer W. The plurality of peripheral introduction ports 52i are opened toward the edge region of the wafer W or an edge of a mounting region MR. The plurality of peripheral introduction ports 52i is arranged along a circumferential direction below the central introduction port 18i and above the mounting table 20. That is, the plurality of peripheral introduction ports 52i are arranged annularly around the axis Z in a region (plasma diffusion region) having a lower electron temperature than a position just below the dielectric window. The peripheral introduction unit 52 supplies the gas to the wafer in the region having a low electron temperature. Accordingly, a degree of dissociation of the gas introduced into the processing space S from the peripheral introduction unit 52 is more suppressed than a degree of dissociation of the gas supplied to the processing space S from the central introduction unit 50.

Figure 19:
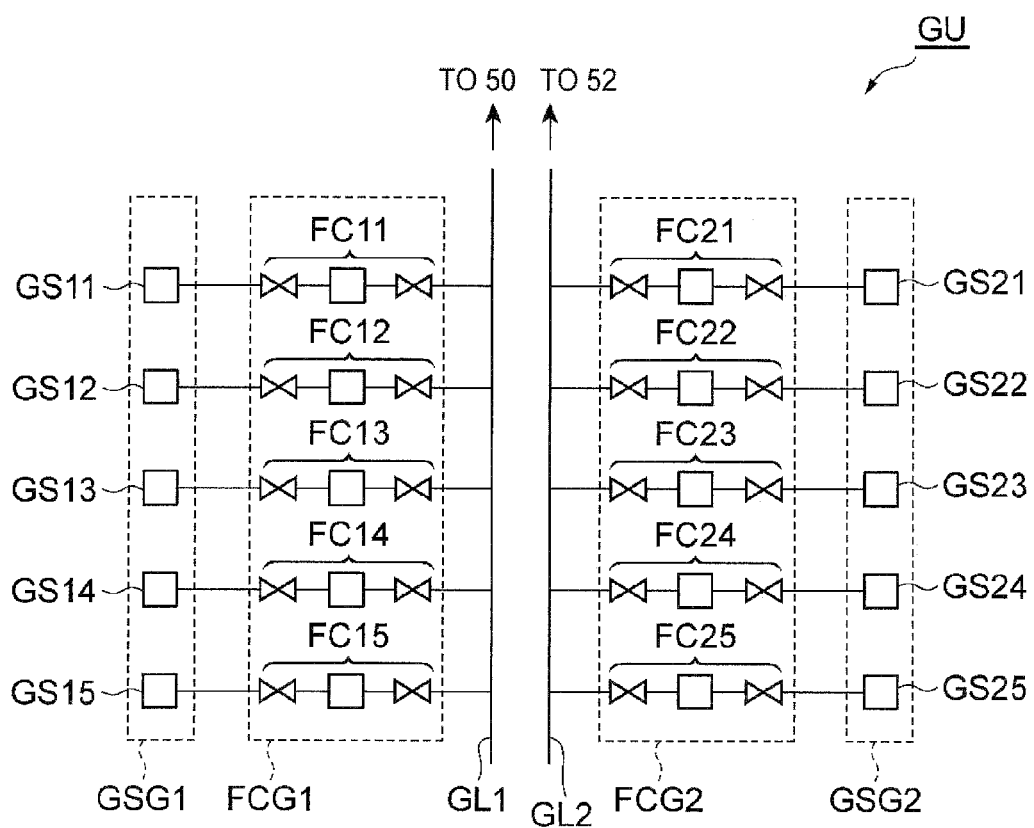
FIG. 19 is a view illustrating a gas supply unit including a first flow control unit group, a first gas source group, a second flow control unit group and a second gas source group.

A first gas source group GSG1 is connected to the central introduction unit 50 through a first flow control unit group FCG1. In addition, a second gas source group GSG2 is connected to the peripheral introduction unit 52 through a second flow control unit group FCG2. FIG. 19 is a view illustrating a gas supply unit including the first flow control unit group, the first gas source group, the second flow control unit group, and the second gas source group. As illustrated in FIG. 19, the first gas source group GSG1, the first flow control unit group FCG1, the second gas source group GSG2, and the second flow control unit group FCG2 constitute a gas supply unit GU of an exemplary embodiment.

The first gas source group GSG1 includes a plurality of first gas sources GS11 to GS15. The gas source GS11 is a source of a hydrogen containing gas, for example of a source of H2 gas. The gas source GS12 is a source of a nitrogen containing gas, for example, a source of N2 gas. The gas source GS13 is a source of a fluorine containing gas. As for the fluorine containing gas, one or more gases selected from the above-described fluorocarbon gas, fluorohydrocarbon gas, NF3 gas, and SF6 gas may be used. The gas source GS14 is a source of a rare gas, for example, a source of Ar gas. Further, the gas source GS15 is a source of the above-described fluorocarbon-based gas.

The first flow control unit group FCG1 includes a plurality of first flow control units FC11 to FC15. Each of the plurality of first flow control units FC11 to FC15 includes, for example, two valves and a flow controller provided between the two valves. The flow controller is, for example, a mass flow controller. The plurality of first gas sources GS11 to GS15 is connected to a common gas line GL1 through the plurality of first flow control units FC11 to FC15, respectively. The common gas line GL1 is connected to the central introduction unit 50.

The second gas source group GSG2 includes a plurality of first gas sources GS21 to GS25. The second gas sources GS21 to GS25 are gas sources which are similar to the gas sources GS11 to GS15, respectively.

The second flow control unit group FCG2 includes a plurality of second flow control units FC21 to FC25. Each of the plurality of second flow control units FC21 to FC25 includes, for example, two valves, and a flow controller installed between the two valves. The flow controller is, for example, a mass flow controller. The plurality of second gas sources GS21 to GS25 is connected to a common gas line GL2 through the plurality of second flow control units FC21 to FC25, respectively. The common gas line GL2 is connected to the peripheral introduction unit 52.

As described above, in the plasma processing apparatus 10, the plurality of first gas sources and the plurality of first flow control units are provided to be exclusively used by the central introduction unit 50, and the plurality of second gas sources and the plurality of second flow control units which are independent from the plurality of first gas sources and the plurality of first flow control units are provide to be exclusively used by the peripheral introduction unit 52. Accordingly, the kind of gas introduced into the processing space S from the central introduction unit 50 and a flow rate of one or more gases introduced into the processing space S from the central introduction unit 50 may be independently controlled. In addition, the kind of gas introduced into the processing space S from the peripheral introduction unit 52, and a flow rate of one or more gases introduced into the processing space S from peripheral introduction unit 52 may be independently controlled.

In an exemplary embodiment, the peripheral introduction unit 52 further includes an annular tube 52p. The annular tube 52p is formed with a plurality of peripheral introduction ports 52i. The annular tube 52p may be formed of, for example, quartz. As illustrated in FIG. 14, in an exemplary embodiment, the annular tube 52p is installed along the inner wall surface of the side wall 12a. In other words, the annular tube 52p is not disposed on the lower surface of the dielectric window 18 and in the mounting region MR, that is, on a route connecting a wafer W. Accordingly, the annular tube 52p does not impede the diffusion of plasma. In addition, since the annular tube 52p is installed along the inner wall surface of the side wall 12a, consumption of the annular tube 52p by plasma may be suppressed, and thus, exchange frequency of the annular tube 52p may be reduced. Further, since the annular tube 52p is installed along the side wall 12 which may be subjected to a temperature control by a heater, the temperature stability of a gas introduced into the processing space S from the peripheral introduction unit 52 may be enhanced.

In addition, in an exemplary embodiment, the plurality of peripheral introduction ports 52i is opened toward the edge region of the wafer W. That is, the plurality of peripheral introduction ports 52i is inclined in relation to a plane orthogonal to the axis Z so as to inject a gas toward the edge region of the wafer W. Since the peripheral introduction ports 52i are opened to be inclined toward the edge region of the wafer W as described above, an active species of the gas injected from the peripheral introduction ports 52i is directly headed for the edge region of the wafer W. As a result, the active species of the gas may be directly supplied to the edge of the wafer W without being deactivated.

In addition, the plasma processing apparatus 10 further includes a control unit Cnt. The control unit Cnt may be a programmable controller such as, for example, a computer device. The control unit Cnt may control each unit of the plasma processing apparatus 10 according to a program based on a recipe.

When step ST1 of the method MT illustrated in FIG. 1 is performed, the control unit Cnt executes a control of causing the gas supply unit GU to supply a reducing gas and the plasma generation unit PG to generate energy. With this control, the gas supply unit GU supplies a mixed gas of the gases from the gas sources GS11, GS12, GS21, GS22 into the processing container 12 as a reducing gas. In addition, with this control, the plasma generation unit PG introduces microwaves into the processing container 12 through the dielectric window 18. As a result, plasma of the reducing gas is generated and the wafer W is exposed to the plasma. In an exemplary embodiment, in this control, the control unit Cnt may stop the supply of a high frequency bias power from the high frequency power source RFG to the plate 22, that is, a high frequency electrode. That is, the control unit Cnt may perform step ST1 in a non-bias manner. Meanwhile, in a control for performing step ST1, the control unit Cnt may cause the gas supply unit GU to supply a rare gas such as, for example, He gas, instead of the gases from the gas sources GS12, GS22.

In addition, when performing step ST2 of the method MT and the method MT2, the control unit Cnt executes a control of causing the gas supply unit GU to supply a processing gas and the plasma generation unit PG to generate energy. With this control, the gas supply unit GU supplies a mixed gas of the gases from the gas sources GS11, GS12, GS13, GS21, GS22, GS23 into the processing container 12 as a processing gas. Further, with this control, the plasma generation unit PG introduces microwaves into the processing container 12 through the dielectric window 18. As a result, plasma of the processing gas is generated and the wafer W is exposed to the plasma. In an exemplary embodiment, in this control, the control unit Cnt may stop the supply of a high frequency bias power from the high frequency power source RFG to the plate 22, i.e., a high frequency electrode.

In addition, when performing step ST3 of the method MT, the control unit Cnt executes a control of causing the gas supply unit GU to supply a rare gas and the plasma generation unit PG to generate energy, and operating the exhaust apparatus 30. With this control, the gas supply unit GU supplies the rare gas from the gas sources GS14, GS24 into the processing container 12. In addition, with this control, the plasma generation unit PG introduces microwaves into the processing container 12 through dielectric window 18. As a result, plasma of the rare gas is generated, and the processing space S within the processing container 12 is exhausted such that the inside of the processing container 12 is cleaned.

In addition, when performing step ST4 of the method MT and the method MT2, the control unit Cnt performs a control of causing the heaters HC and HE to generate heat. In this control, the control unit Cnt may control the gas supply unit GU to supply the rare gas from the gas sources GS14, GS24 into the processing container 12.

In addition, when step ST4 according to another exemplary embodiment of the method MT and the method MT2, the control unit Cnt performs a control of causing the gas supply unit GU to supply a rare gas and the plasma generation unit PG to generate energy. With this control, the gas supply unit GU supplies the rare gas from the gas sources GS14, GS24 into the processing container 12. Further, with this control, the plasma generation unit PG introduces microwaves into the processing container 12 through the dielectric window 18. As a result, plasma of the rare gas is generated, and the wafer W is exposed to the plasma. In an exemplary embodiment, in this control, the control unit Cnt may stop the supply of a high frequency bias power from the high frequency power source RFG to the plate 22, that is, a high frequency electrode.

In still another exemplary embodiment, prior to performing the sequence illustrated in FIG. 1 multiple times, in order to perform a step of exposing the wafer W to the plasma of the above-described fluorocarbon-based gas or in order to perform step STa of the method MT2, the control unit Cnt executes a control of causing the gas supply unit GU to supply the fluorocarbon-based gas and the plasma generation unit PG to generate energy. With this control, the gas supply unit GU supplies the fluorocarbon-based gas from the gas sources GS15, GS25 into the processing container 12. In addition, with this control, the plasma generation unit PG introduces microwaves into the processing container 12 through the dielectric window 18. As a result, plasma of the fluorocarbon-based gas is generated and the wafer W is exposed to the plasma. Meanwhile, in this control, the control unit Cnt may cause the gas supply unit GU to supply, for example, a rare gas, into the processing container in addition to the fluorocarbon-based gas. In addition, in this control, the control unit Cnt may cause the high frequency power source RFG to supply a high frequency bias power to the plate 22.

Hereinafter, Test Examples performed using the plasma processing apparatus 10 will be described.

Test Example 1

In Test Example 1, a sequence processing including step ST2 and step ST4 was performed once on wafers having a silicon oxide film. In addition, in Test Example 1, the pressure within the processing container 12 when performing step ST2 was variously set as a variable parameter. The other processing conditions of Test Example 1 were as follows.

Figure 20:
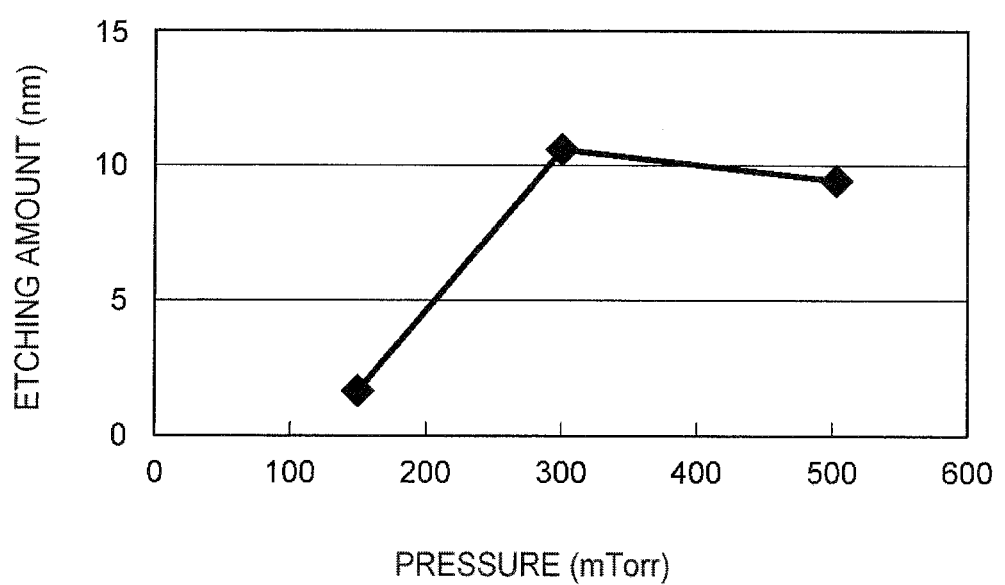
FIG. 20 is a graph representing a result of Test Example 1.

<Step ST2>
  Microwave power: 2000 W
  Processing gas
    $H_2$ gas: 185 sccm
    $N_2$ gas: 500 sccm
    $SF_6$ gas: 45 sccm
  Wafer temperature: 30° C.
  Non-bias
  Processing time: 30 sec
<Step ST4>
  Pressure within the processing container 12: 10 mTorr (1.333 Pa)
  Microwave power: 0 W
  Ar gas: 500 sccm
  Wafer temperature: 120° C.
  Non-bias
  Processing time: 60 sec In Test Example 1, a changed amount in film thickness of silicon oxide films before and after the processing, i.e., an etching amount was measured. The result is represented in FIG. 20. In FIG. 20, the horizontal axis represents a pressure within the processing container 12 when performing step ST2, and the vertical axis represents an etching amount. As represented in FIG. 20, at a result of Test Example 1, it was found that a relatively large etching amount may be obtained when the pressure within the processing container 12 at the time of performing step ST2 is in a range of 40 Pa (300 mTorr) to 66.66 Pa (500 mTorr).

Test Example 2

Figure 21:
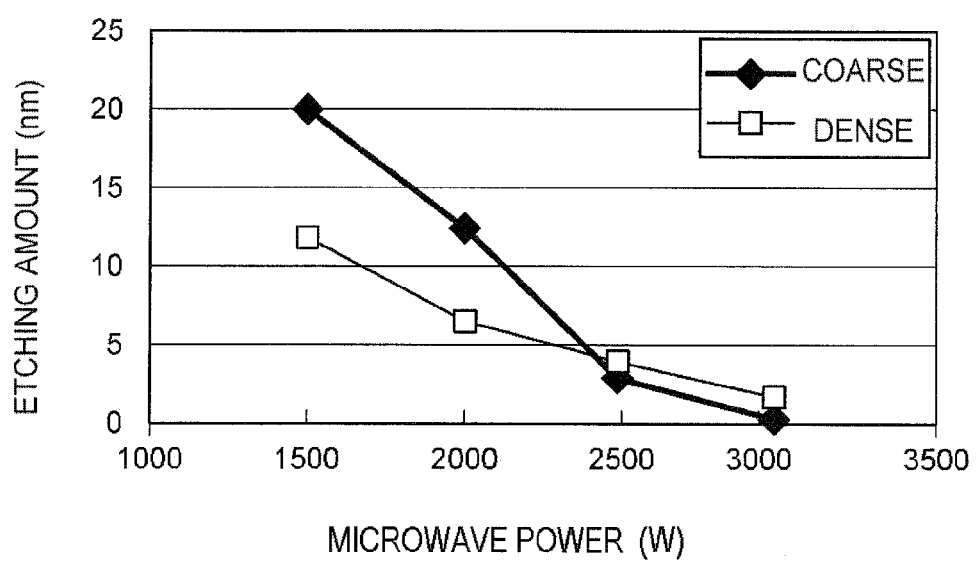
FIG. 21 is a graph representing a result of Test Example 2.

In Test Example 2, a sequence processing including steps ST2 and ST4 was performed twice on wafers having a region where a first region formed of silicon oxide and a second region formed of silicon were densely formed (hereinafter, referred to as a "dense region") and a region where the first region and the second region were coarsely formed (hereinafter, referred to as a "coarse region"). In addition, in Test Example 2, the microwave power at the time of performing step ST2 was variously set as a variable parameter. The other processing conditions of Test Example 2 were as follows.
<Step ST2>
  Pressure within the processing container 12: 500 mTorr (66.66 Pa)
  Processing gas
    $H_2$ gas: 240 sccm
    $N_2$ gas: 500 sccm
    $SF_6$ gas: 45 sccm
  Wafer temperature: 50° C.
  Non-bias
  Processing time: 90 sec
<Step ST4>
  Pressure within the processing container 12: 10 mTorr (1.333 Pa)
  Microwave power: 0 W
  Ar gas: 500 sccm
  Wafer temperature: 80° C.
  Non-bias
  Processing time: 600 sec In Test Example 2, a changed amount in film thickness of silicon oxide films before and after the processing, i.e., an etching amount was measured at each of the coarse region and the dense region. The result is represented in FIG. 21. The horizontal axis in FIG. 21 represents a microwave power when performing step ST2, and the vertical axis represents an etching amount. As represented in FIG. 21, as a result of Test Example 2, it was found that the difference in etching amount between the coarse region and the dense region is reduced when the microwave power at the time of performing step ST2 is in a range of 2000 W to 3000 W.

Test Example 3

Figure 22:
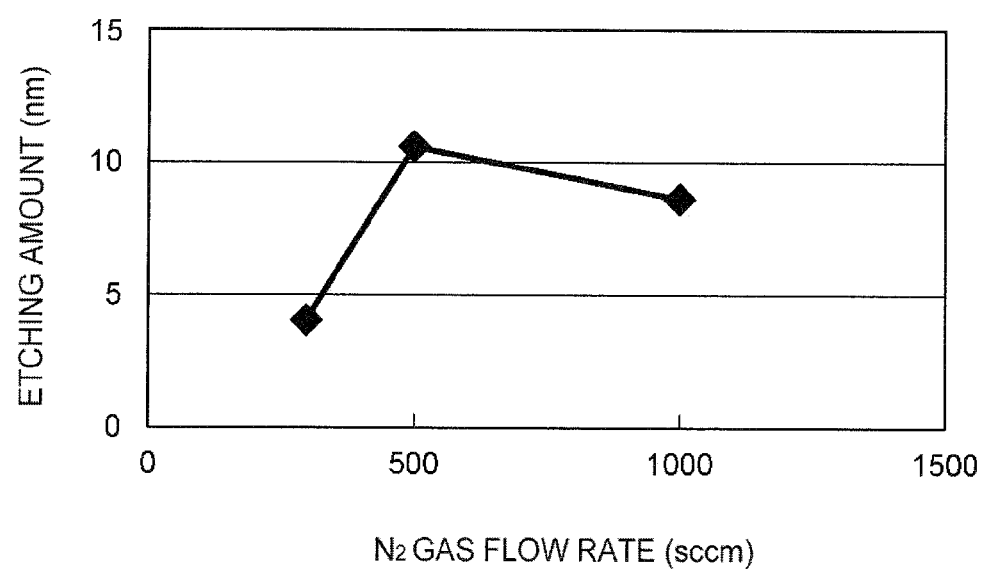
FIG. 22 is a graph representing a result of Test Example 3.

In Test Example 3, i.e., Test Example 3-1, Test Example 3-2, and Test Example 33, a sequence processing including step ST2 and step ST4 was performed once to three times on wafers having a silicon oxide film. In addition, in Test Example 3-1, Test Example 3-2, and Test Example 3-3, the flow rate of $N_2$ gas at the time of performing step ST2 was variously set as a variable parameter. Specifically, in Test Example 3-1, the flow rate of $N_2$ gas in step ST2 was set to 300 sccm, and the sequence processing was performed three times. In Test Example 3-2, the flow rate of $N_2$ gas in step ST2 was set to 500 sccm, and the sequence processing was performed once. In addition, in Test Example 3-3, the flow rate of $N_2$ gas in step ST2 was set to 1000 sccm and the sequence processing was performed once. The other processing conditions were as follows.
<Step ST2 in Test Example 3-1 ST2>
  Pressure within the processing container 12: 500 mTorr (66.66 Pa)
  Microwave power: 2000 W
  Processing gas
    $H_2$ gas: 240 sccm
    $N_2$ gas: 300 sccm
    $SF_6$ gas: 45 sccm
  Wafer temperature: 15° C.
  Non-bias
  Processing time: 30 sec
<Step ST4 in Test Example 3-1>
  Pressure within the processing container 12: 20 mTorr (2.666 Pa)
  Microwave power: 2000 W
  Ar gas: 500 sccm
  Wafer temperature: 50° C.
  Non-bias
  Processing time: 30 sec
<Step ST2 in Test Example 3-2>
  Pressure within the processing container 12: 500 mTorr (66.66 Pa)
  Microwave power: 2000 W
  Processing gas
    $H_2$ gas: 240 sccm
    $N_2$ gas: 500 sccm
    $SF_6$ gas: 45 sccm
  Wafer temperature: 30° C.
  Non-bias
  Processing time: 30 sec
<Step ST4 in Test Example 3-2>
  Pressure within the processing container 12: 100 mTorr (13.33 Pa)
  Microwave power: 2000 W
  He gas: 500 sccm
  Wafer temperature: 30° C.
  Non-bias
  Processing time: 90 sec
<Step ST2 in Test Example 3-3>
  Pressure within the processing container 12: 500 mTorr (66.66 Pa)
  Microwave power: 2000 W
  Processing gas
    $H_2$ gas: 240 sccm N₂ gas: 1000 sccm
SF₆ gas: 60 sccm
Wafer temperature: 30° C.
Non-bias
Processing time: 30 sec
<Step ST4 in Test Example 3-3>
Pressure within the processing container 12: 100 mTorr (13.33 Pa)
Microwave power: 2000 W
He gas: 500 sccm
Wafer temperature: 30° C.
Non-bias
Processing time: 90 sec In Test Example 3, a changed amount in film thickness of the silicon oxide films before and after the processing, that is, an etching amount was measured. The result (an etching amount per one sequence) is represented in FIG. 22. In FIG. 22, the horizontal axis represents a flow rate of N₂ gas when step ST2 is performed, and the vertical axis represents an etching amount. As represented in FIG. 22, it was found that a relatively large etching amount may be obtained when the flow rate of N₂ gas at the time of performing step ST2 is in a range of 300 sccm to 1000 sccm.

Test Example 4

Figure 23:
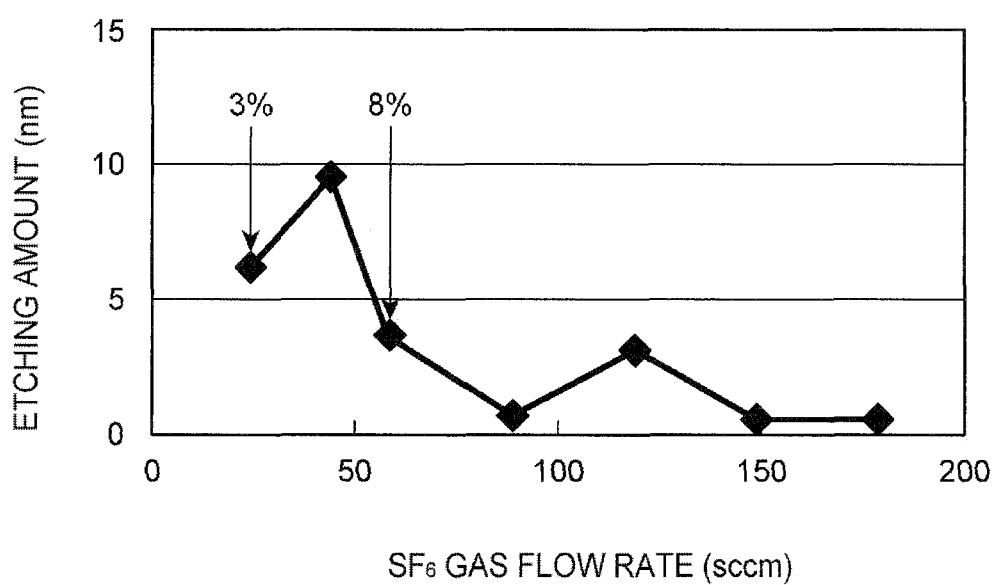
FIG. 23 is a graph representing a result of Test Example 4.

In Test Example 4, a sequence processing including step ST2 and step ST4 is performed once on wafers having a silicon oxide film. In addition, in Test Example 4, the flow rate of SF₆ gas at the time of performing step ST2 was variously set as a variable parameter. The other processing conditions in Test Example 4 were as follows.
<Step ST2>
Pressure within the processing container 12: 500 mTorr (66.66 Pa)
Microwave power: 2000 W
Processing gas
H₂ gas: 185 sccm
N₂ gas: 500 sccm
Wafer temperature: 30° C.
Non-bias
Processing time: 30 sec
<Step ST4>
Pressure within the processing container 12: 10 mTorr (1.333 Pa)
Microwave power: 0 W
Ar gas: 500 sccm
Wafer temperature: 120° C.
Non-bias
Processing time: 60 sec In Test Example 4, a changed amount in film thickness of silicon oxide films before and after the processing, that is, an etching amount. The result is represented in FIG. 23. The horizontal axis in FIG. 23 represents a flow rate of SF₆ gas at the time of performing step ST2 and the vertical axis represents an etching amount. As represented in FIG. 23, as a result of Test Example 4, it was found that a relatively large etching amount may be obtained when a ratio occupied by the flow rate of SF₆ gas in the entire flow rate of the processing gas at the time of performing step ST2 is in a range of 3% to 8%.

Test Example 5

Figure 24:
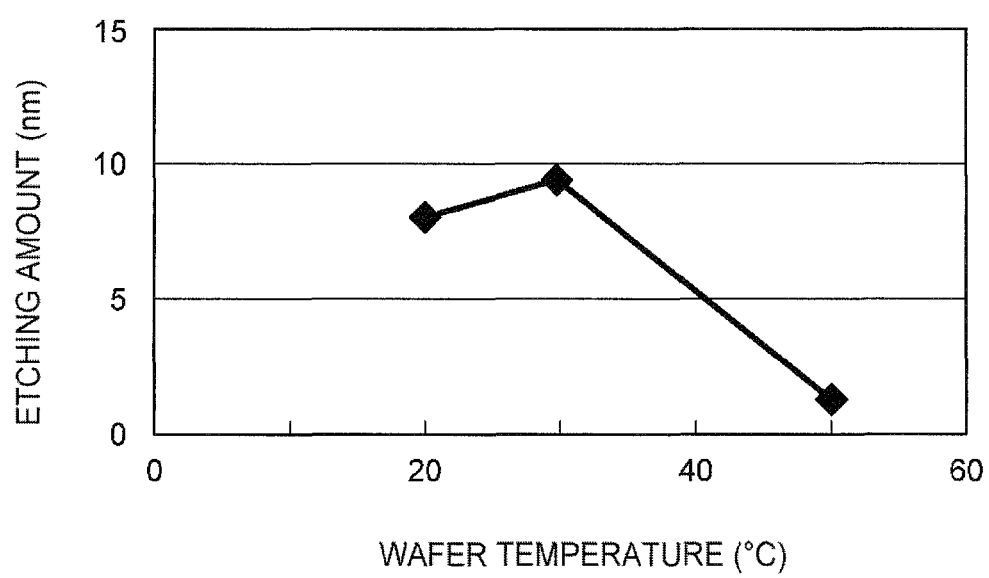
FIG. 24 is a graph representing a result of Test Example 5.

In Test Example 5, a sequence processing including step ST2 and step ST4 was performed once on wafers having a silicon oxide film. In addition, in Test Example 5, the wafer temperature at the time of performing step ST2 was variously set as a variable parameter. The other processing conditions in Test Example 5 were as follows.
<Step ST2>
Pressure within the processing container 12: 500 mTorr (66.66 Pa)
Microwave power: 2000 W
Processing gas
H₂ gas: 240 sccm
N₂ gas: 500 sccm
SF₆ gas: 45 sccm
Non-bias
Processing time: 30 sec
<Step ST4>
Pressure within the processing container 12: 20 mTorr (2.666 Pa)
Microwave power: 2000 W
Ar gas: 500 sccm
Wafer temperature: 30° C.
Non-bias
Processing time: 90 sec In Test Example 5, a changed amount in film thickness of silicon oxide films before and after the processing, i.e., an etching amount. The result is represented in FIG. 24. The horizontal axis in FIG. 24 represents a wafer temperature and the vertical axis represents an etching amount. As illustrated in FIG. 24, as a result of Test Example 5, it was found that a relatively large etching amount may be obtained when the wafer temperature at the time of performing step ST2 is in a range of 20° C. to 40° C.

Test Examples 6 to 11

Figure 25A:
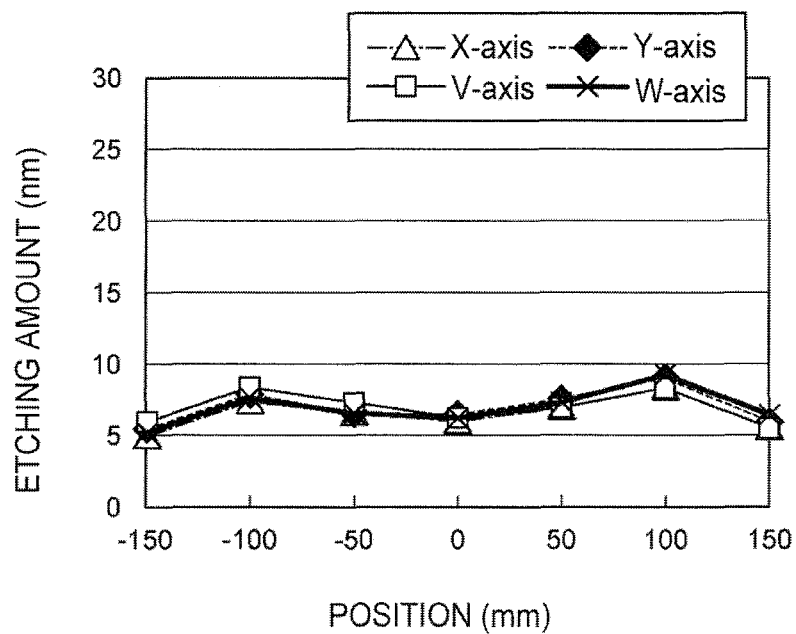
FIGS. 25A and 25B are graphs representing results of Test Examples 6 and 7.
Figure 25B:
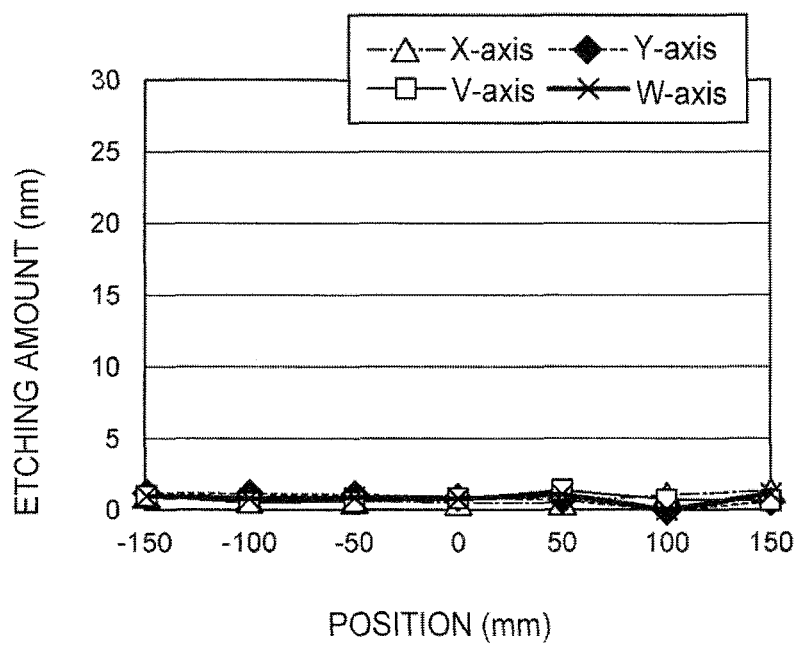
Figure 26A:
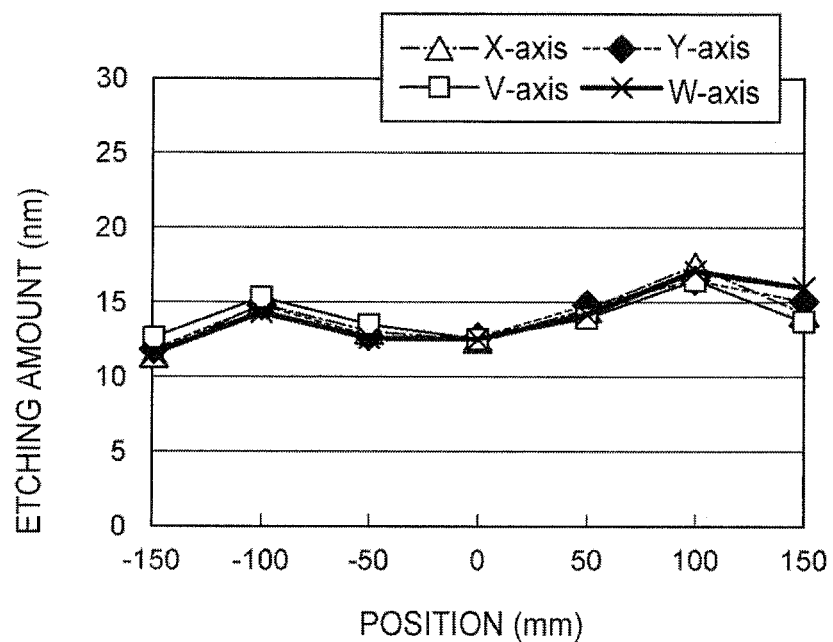
FIGS. 26A and 26B are graphs representing results of Test Examples 8 and 9.
Figure 26B:
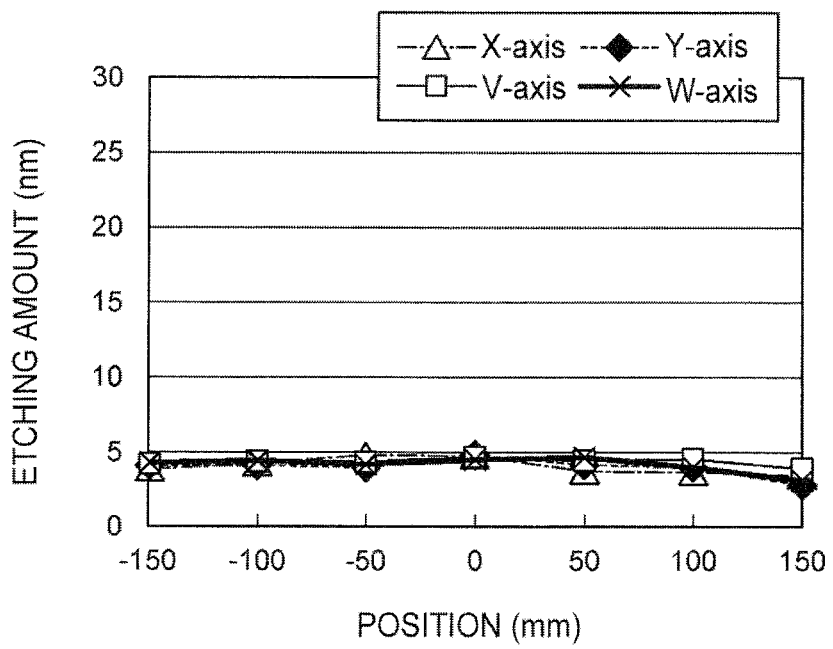
Figure 27A:
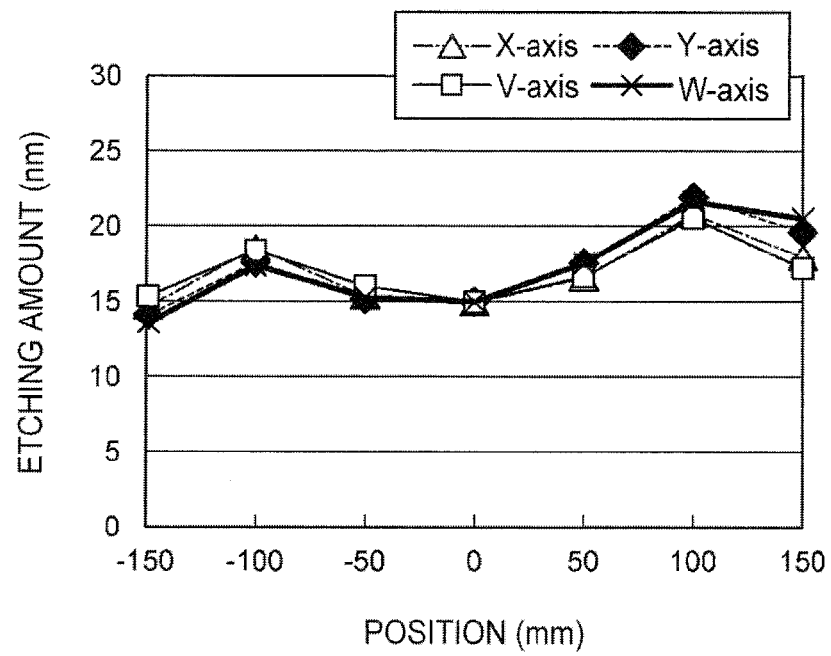
FIGS. 27A and 27B are graphs representing results of Test Examples 10 and 11.
Figure 27B:
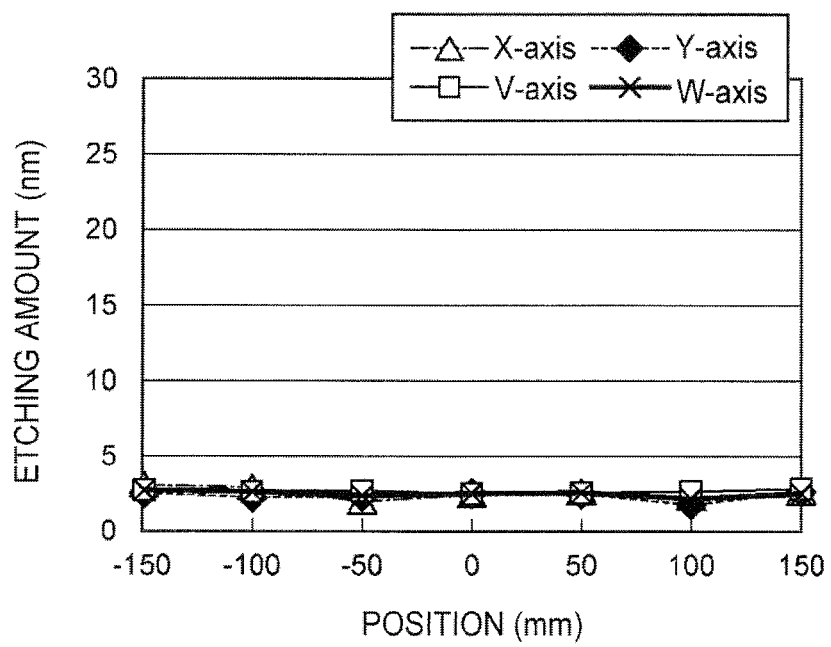

In Test Example 6, a sequence including step ST2 and step ST4 was performed once on wafers having a silicon oxide film. In Test Example 7, a sequence including step ST2 and step ST4 was performed once on wafers having a polysilicon film. In Test Example 8, a sequence including step ST2 and step ST4 was performed twice on wafers having a silicon oxide film. In Test Example 9, a sequence including step ST2 and step ST4 was performed twice on wafers having a polysilicon film. Meanwhile, in Test Examples 8 and 9, step ST1 was not performed in the second sequence. In Test Example 10, a sequence including step ST2 and step ST4 was performed twice on wafers having a silicon oxide film and step ST1 was performed in the second sequence. In Test Example 11, a sequence including step ST2 and step ST4 was performed twice on wafers having a polysilicon film and step ST1 was performed in the second sequence and step ST1 was performed in the second sequence. The conditions in step ST1, step ST2, and step ST4 were as follows.
<Step ST1>
Pressure within the processing container 12: 500 mTorr (66.66 Pa)
Microwave power: 2000 W
Flow rate of H₂ gas: 240 sccm
Flow rate of N₂ gas: 500 sccm
Wafer temperature: 50° C.
Non-bias
Processing time: 30 sec
<Step ST2>
Pressure within the processing container 12: 500 mTorr (66.66 Pa)
Microwave power: 2000 W
Processing gas
H₂ gas: 240 sccm
N₂ gas: 500 sccm SF$_6$ gas: 45 sccm
Non-bias
Wafer temperature: 50° C.
processing time: 90 sec
<Step ST4>
Pressure within the processing container 12: 10 mTorr (1.333 Pa)
Ar gas: 500 sccm
Wafer temperature: 80° C.
Processing time: 10 min In Test Examples 6 to 11, a changed amount in film thickness of silicon oxide films before and after the processing, i.e., an etching amount was measured on each of four diameters passing through the centers of wafers at 45 degree intervals, that is, an X-axis, a Y-axis, a V-axis, and a W-axis. The etching amounts obtained in Test Examples 6 and 7 are represented in FIGS. 25A and 25B, respectively, the etching amounts obtained in Test Examples 8 and 9 are represented in FIGS. 26A and 26B, respectively, and the etching amounts obtained in Test Examples 10 and 11 are represented in FIGS. 27A and 27B, respectively. In FIGS. 25A and 25B to FIGS. 27A and 27B, each horizontal axis represents a position from a wafer center, and each vertical axis represents an etching amount. In the first sequence, each silicon oxide film was etched, as represented in FIG. 25A, and each polysilicon film was not substantially etched, as illustrated in FIG. 25B. In addition, after the second sequence, the silicon oxide film was etched in an etching amount larger than that in the first sequence as represented in FIGS. 26A and 27A. However, in Test Example 9, since step ST1 was not performed in the second sequence, polysilicon films were also etched, as represented in FIG. 26B. Meanwhile, in Test Example 11, since step ST1 was performed in the second sequence, the etching amounts of polysilicon films were reduced as compared those in Test Example 9, as represented in FIG. 27B.

Test Examples 12 and 13

In Test Examples 12 and 13, a sequence including step ST2 and step ST4 was performed once on wafers including a silicon oxide film. In Test Example 12, the wafer temperature at the time of performing step ST4 was set to 120° C., in Test Example 13, the wafer temperature at the time of performing step ST2 was set to 80° C. The other processing conditions in Test Examples 12 and 13 were as follows.
<Step ST2>
Pressure within the processing container 12: 500 mTorr (66.66 Pa)
Microwave power: 2000 W
Processing gas
H$_2$ gas: 185 sccm
N$_2$ gas: 500 sccm
SF$_6$ gas: 45 sccm
Non-bias
Processing time: 30 sec
<Step ST4>
Pressure within the processing container 12: 10 mTorr (1.333 Pa)
Ar gas: 500 sccm
In order to etching the silicon oxide films by the same amount in the thickness direction, in Test Example 12, the processing time of one minute is required for step ST4, and in Test Example 13, the processing time of 10 minutes was required for step ST4. That is, it was found that in step ST4 in which a denatured region is removed, the processing time of step ST4 may be reduced as the wafer temperature increased.

Although various exemplary embodiments have been described above, various modified aspect may be configured without being limited to the above-described exemplary embodiments. For example, in performing the method MT, an inductive coupling type plasma processing apparatus may be used without being limited to the plasma processing apparatus which uses microwaves as a plasma source.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of selectively removing a first region from a workpiece which includes the first region formed of silicon oxide and a second region formed of silicon, the method comprising: performing a plurality of sequences, each sequence including: forming a denatured region by generating plasma of a processing gas that contains hydrogen, nitrogen, and fluorine within a processing container that accommodates the workpiece so as to denature a portion of the first region, and removing the denatured region within the processing container, wherein after performing the plurality of sequences such that the second region of the workpiece is exposed to the plasma of the processing gas to form an oxidized region in the second region, exposing the workpiece to plasma of a reducing gas which is generated within the processing container in order to reduce the oxidized region of the second region of the workpiece.

2. The method of claim 1, wherein, in the removing of the denatured region, the workpiece is heated within the processing container.

3. The method of claim 1, wherein, in the removing of the denatured region, the workpiece is exposed to plasma of a rare gas which is generated within the processing container.

4. The method of claim 3, further comprising:
cleaning an inside of the processing container after taking out the workpiece from the processing container, between the forming of the denatured region and the removing of the denatured region.

5. The method of claim 1, wherein in the workpiece at an initial state, the second region is buried in the first region, the method further includes exposing the workpiece to plasma of a fluorocarbon-based gas within the processing container, and
the plurality of sequences are performed after the exposing of the workpiece to the plasma of the fluorocarbon-based gas.

6. The method of claim 1, wherein the second region forms a fin region of a fin type field effect transistor.

7. The method of claim 1, wherein the processing gas includes SF$_6$ gas.

8. The method of claim 1, wherein the method is performed in a plasma processing apparatus which is provided with the processing container and uses microwaves as a plasma source.

9. The method of claim 8, wherein in the forming of the denatured region, a pressure within the processing container is set to be in a range of 40 Pa to 66.66 Pa.

10. The method of claim 8, wherein, in the forming of the denatured region, a power of the microwave power is set to be in a range of 800 W to 3000 W.

11. The method of claim 8, wherein, in the forming of the denatured region, the processing gas includes $N_2$ gas, and a flow rate of the $N_2$ gas is set to be in a range of 300 sccm to 1000 sccm.

12. The method of claim 8, wherein, in the forming of the denatured region, the processing gas includes $SF_6$ gas, and a ratio occupied by a flow rate of the $SF_6$ gas in an entire flow rate of the processing gas is set to be in a range of 3% to 8%.

13. A plasma processing apparatus comprising:
a processing container;
a mounting table including a temperature control mechanism and configured to place a workpiece including a first region to be etched and a second region to remain thereon within the processing container;
a gas supply unit configured to supply a processing gas containing hydrogen, nitrogen, and fluorine, and a reducing gas into the processing container;
a plasma generation unit configured to generate a plasma for exciting a gas supplied into the processing container; and
a control unit configured to control the temperature control mechanism, the gas supply unit, and the plasma generation unit,
wherein the control unit is programmed to sequentially perform:
a first control of causing the gas supply unit to supply the processing gas and the plasma generation unit to generate a plasma of the processing gas to expose the workpiece to the plasma of the processing gas such that the first region of the workpiece is denatured to form a denatured region in the first region; and
a second control of causing the temperature control mechanism to heat the mounting table supporting the workpiece such that the denatured region of the first region is thermally decomposed and removed, and
wherein, after sequentially performing the first control and the second control a plurality of times such that the second region of the workpiece is exposed to the plasma of the processing gas to form an oxidized region in the second region, the control unit is further programmed to perform a third control of causing the gas supply unit to supply the reducing gas and the plasma generation unit to generate a plasma of the reducing gas such that the workpiece is exposed to the plasma of the reducing gas in order to reduce the oxidized region of the second region of the workpiece.

14. The plasma processing apparatus of claim 13, wherein, in the first control, a bias power is not supplied to the mounting table.

15. The plasma processing apparatus of claim 13, wherein the gas supply unit further supplies a fluorocarbon-based gas into the processing container,
the control unit further performs a fourth control of causing the gas supply unit to supply the fluorocarbon-based gas and causing the plasma generation unit to generate a plasma of the fluorocarbon-based gas, prior to the plurality of sequences.

16. The plasma processing apparatus of claim 13, wherein the processing gas includes $SF_6$ gas.

17. The plasma processing apparatus of claim 13, wherein the plasma generation unit introduces microwaves into the processing container as the energy.

18. The plasma processing apparatus of claim 17, wherein, in the first control, the control unit sets a pressure within the processing container to be in a range of 40 Pa to 66.66 Pa.

19. The plasma processing apparatus of claim 17, wherein, in the first control, the control unit sets a power of the microwaves to be in a range of 800 W to 3000 W.

20. The plasma processing apparatus of claim 17, wherein the processing gas includes $N_2$ gas, and in the first control, the control unit sets a flow rate of the $N_2$ gas to be in a range of 300 sccm to 1000 sccm.

21. The plasma processing apparatus of claim 17, wherein the processing gas includes $SF_6$ gas, and in the first control, the control unit sets a ratio occupied by a flow rate of the $SF_6$ gas in an entire flow rate of the processing gas to be in a range of 3% to 8%.

22. A plasma processing apparatus comprising:
a processing container;
a mounting table including a temperature control mechanism and configured to place a workpiece including a first region to be etched and a second region to remain thereon within the processing container;
a gas supply unit configured to supply a processing gas containing hydrogen, nitrogen, and fluorine, a rare gas, and a reducing gas into the processing container;
a plasma generation unit configured to generate a plasma for exciting a gas supplied into the processing container; and
a control unit configured to control the gas supply unit and the plasma generation unit,
wherein the control unit is programmed to sequentially perform:
a first control of causing the gas supply unit to supply the processing gas and the plasma generation unit to generate a plasma of the processing gas to expose the workpiece to the plasma of the processing gas such that the first region of the workpiece is denatured to form a denatured region in the first region; and
a second control of causing the gas supply unit to supply the rare gas and the plasma generation unit to generate a plasma of the rare gas such that the workpiece is exposed to the plasma of the rare gas in order to remove the denatured region; and
wherein, after sequentially performing the first control and the second control a plurality of times such that the second region of the workpiece is exposed to the plasma of the processing gas to form an oxidized region in the second region, the control unit is further programmed to perform a third control of causing the gas supply unit to supply the reducing gas and the plasma generation unit to generate a plasma of the reducing gas such that the workpiece is exposed to the plasma of the reducing gas in order to reduce the oxidized region of the second region of the workpiece.

23. The plasma processing apparatus of claim 22, wherein the control unit performs a control to clean an inside of the processing container between the first control and the second control.

* * * * *